(12) United States Patent
Kim et al.

(10) Patent No.: US 12,106,719 B2
(45) Date of Patent: Oct. 1, 2024

(54) DISPLAY DEVICE

(71) Applicant: Samsung Display Co., Ltd., Yongin-Si (KR)

(72) Inventors: Bogyeong Kim, Yongin-si (KR); Doo-Young Lee, Yongin-si (KR); Tak-Young Lee, Yongin-si (KR); Boyong Chung, Yongin-si (KR); Byungseok Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/507,102

(22) Filed: Nov. 13, 2023

(65) Prior Publication Data

US 2024/0265872 A1 Aug. 8, 2024

(30) Foreign Application Priority Data

Feb. 3, 2023 (KR) ........................ 10-2023-0015038

(51) Int. Cl.
  *G09G 3/32* (2016.01)
  *G09G 3/3258* (2016.01)
  *H10K 59/121* (2023.01)
  *H10K 59/131* (2023.01)

(52) U.S. Cl.
  CPC ......... *G09G 3/3258* (2013.01); *H10K 59/121* (2023.02); *H10K 59/131* (2023.02); *G09G 2300/0426* (2013.01); *G09G 2300/0842* (2013.01)

(58) Field of Classification Search
  None
  See application file for complete search history.

(56) References Cited

U.S. PATENT DOCUMENTS

| 11,659,748 B2 | 5/2023 | Hong et al. |
| 2016/0217743 A1* | 7/2016 | Kim ..................... H10K 59/131 |
| 2022/0223672 A1 | 7/2022 | Lee et al. |

FOREIGN PATENT DOCUMENTS

| KR | 10-0681039 B1 | 2/2007 |
| KR | 10-2021-0096583 A | 8/2021 |
| KR | 10-2021-0115084 A | 9/2021 |
| KR | 10-2022-0100771 A | 7/2022 |

* cited by examiner

*Primary Examiner* — Carl Adams
(74) *Attorney, Agent, or Firm* — Innovation Counsel LLP

(57) ABSTRACT

A display device includes a substrate, a first conductive layer disposed on the substrate, a second conductive layer disposed on the first conductive layer and a third conductive layer disposed on the second conductive layer. The first conductive layer includes a data line extending in a first direction. The second conductive layer includes a first scan line extending in a second direction intersecting the first direction, and a second scan line spaced apart from the first scan line and extending in the second direction. The third conductive layer includes a first driving voltage line extending in the second direction, a first common voltage line spaced apart from the first driving voltage line and extending in the second direction, and a pixel electrode disposed between the first driving voltage line and the first common voltage line in a plan view.

20 Claims, 16 Drawing Sheets

DISPLAY DEVICE

CROSS-REFERENCE TO RELATED APPLICATION(S)

This application claims priority under 35 USC § 119 to Korean Patent Application No. 10-2023-0015038 filed on Feb. 3, 2023, in the Korean Intellectual Property Office (KIPO), the entire disclosure of which is incorporated by reference herein.

BACKGROUND

1. Field

Embodiments relate to a display device. More specifically, embodiments relate to a display device that provides visual information.

2. Description of the Related Art

As information technology develops, the importance of display devices, which are communication media between users and information, is being highlighted. Accordingly, display devices such as liquid crystal display devices, organic light emitting display devices, plasma display devices, or the like are widely used in various fields.

The display device includes a transistor layer and a light emitting element layer disposed on the transistor layer. The transistor layer has a structure in which a plurality of conductive patterns overlap each other, and generates a driving current. Light emitting elements included in the light emitting element layer receive the driving current, and emit light.

SUMMARY

Embodiments provide a display device with improved display quality.

A display device according to an embodiment of the present disclosure includes a substrate, a first conductive layer disposed on the substrate, a second conductive layer disposed on the first conductive layer and a third conductive layer disposed on the second conductive layer. The first conductive layer includes a data line extending in a first direction. The second conductive layer includes a first scan line extending in a second direction intersecting the first direction, and a second scan line spaced apart from the first scan line and extending in the second direction. The third conductive layer includes a first driving voltage line extending in the second direction, a first common voltage line spaced apart from the first driving voltage line and extending in the second direction, and a pixel electrode disposed between the first driving voltage line and the first common voltage line in a plan view.

In an embodiment, the second scan line may overlap at least one of the first driving voltage line and the first common voltage line in the plan view.

In an embodiment, the first scan line may not overlap the first driving voltage line and the first common voltage line in the plan view.

In an embodiment, the first driving voltage line and the first common voltage line may be alternately disposed along the first direction.

In an embodiment, the first conductive layer may further include a second common voltage line extending in the first direction, and a second driving voltage line extending in the first direction.

In an embodiment, the first driving voltage line may be electrically connected to the second driving voltage line, and the first common voltage line may be electrically connected to the second common voltage line.

In an embodiment, the first driving voltage line may include a first line portion extending in the second direction, and a first branch portion protruding from the first line portion in the first direction.

In an embodiment, the first branch portion may overlap the second driving voltage line in the plan view, and the first driving voltage line may be electrically connected to the second driving voltage line through the first branch portion.

In an embodiment, the first common voltage line may include a second line portion extending in the second direction, and a second branch portion protruding from the second line portion in a direction opposite to the first direction.

In an embodiment, the second branch portion may overlap the second common voltage line in the plan view, and the first common voltage line may be electrically connected to the second common voltage line through the second branch portion.

In an embodiment, the first conductive layer may further include a capacitor electrode.

In an embodiment, the display device may further include a gate conductive layer disposed between the first conductive layer and the second conductive layer. The gate conductive layer may include a first gate line extending in the first direction, and a second gate line spaced apart from the first gate line and extending in the first direction.

In an embodiment, the first gate line may be electrically connected to the first scan line and the second gate line may be electrically connected to the second scan line.

In an embodiment, the gate conductive layer may further include a gate electrode overlapping the capacitor electrode in the plan view and the gate electrode may form a storage capacitor together with the capacitor electrode.

In an embodiment, the display device may further include an active layer disposed between the first conductive layer and the gate conductive layer. The active layer may include an active pattern overlapping the first gate line in the plan view and electrically connected to the gate electrode.

In an embodiment, the second conductive layer may further include a data electrode and the data electrode may electrically connect the active pattern and the data line.

In an embodiment, the first scan line may include a first line portion extending in the second direction, and a first branch portion protruding from the first line portion in the first direction.

In an embodiment, the display device may further include an active layer disposed between the first conductive layer and the second conductive layer. The active layer may include an active pattern overlapping the capacitor electrode and the first branch portion of the first scan line in the plan view, and the active pattern may form a storage capacitor together with the capacitor electrode.

In an embodiment, the second scan line may include a second line portion extending in the second direction, and a second branch portion protruding from the second line portion in a direction opposite to the first direction.

In an embodiment, the data line may overlap the first driving voltage line and the first common voltage line in the plan view.

In a display device according to embodiments of the present disclosure, a driving voltage line and a common voltage line may be disposed on the same layer as pixel electrodes. Accordingly, each parasitic capacitance between the driving voltage line and data lines and between the common voltage line and the data lines may be reduced, and a sufficient space of a storage capacitor may be secured.

In addition, a first scan line may not overlap each of the driving voltage line and the common voltage line, and a second scan line may overlap at least one of the driving voltage line and the common voltage line. As parasitic capacitance between the second scan line and at least one of the driving voltage line and the common voltage line increases, an interval between a first scan signal and a second scan signal may be secured. Accordingly, display quality of the display device may be improved.

DETAILED DESCRIPTION OF THE EMBODIMENTS

Figure 1:
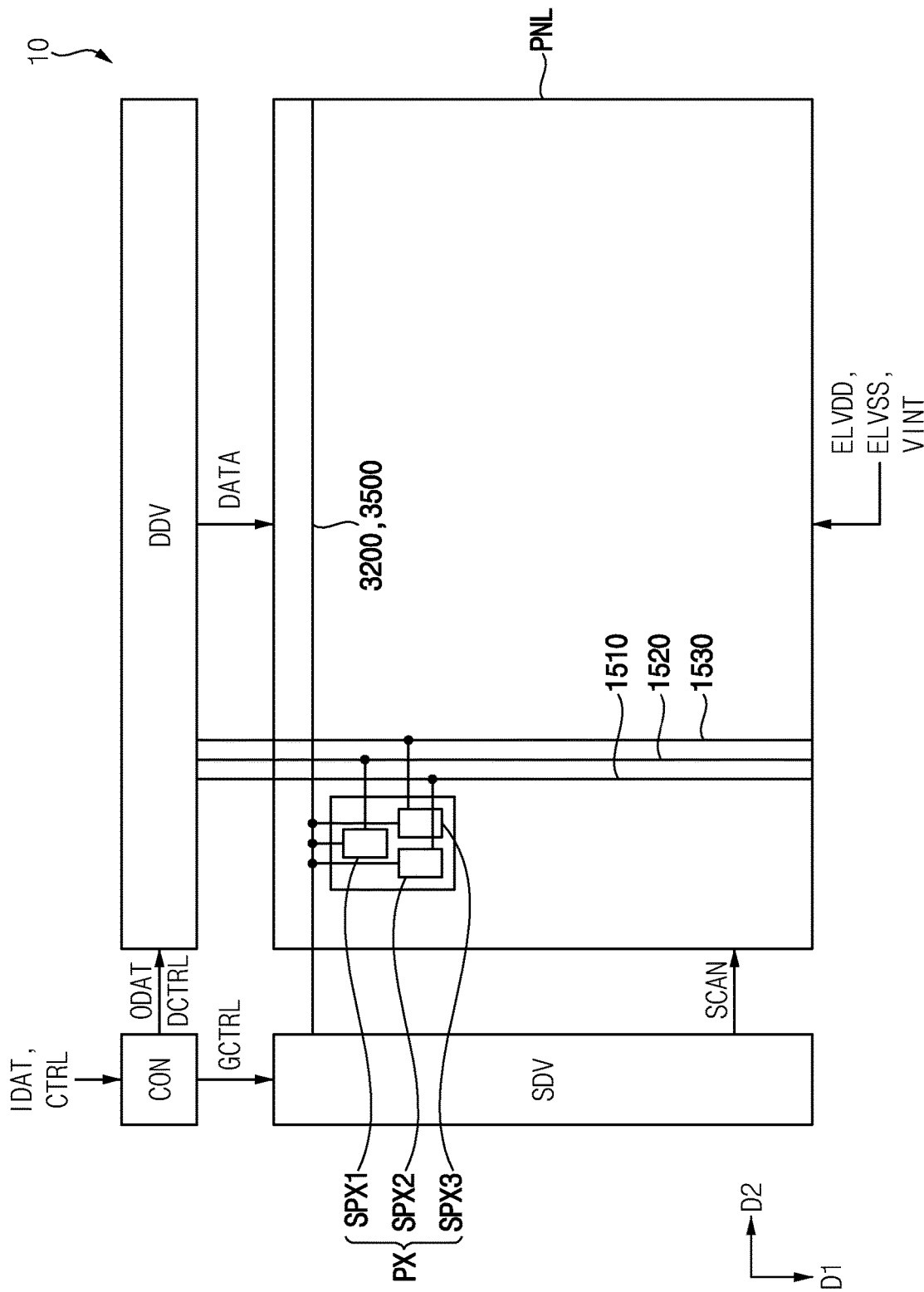
FIG. 1 is a block diagram illustrating a display device according to an embodiment of the present disclosure.

Hereinafter, embodiments of the present disclosure will be described in more detail with reference to the accompanying drawings. The same reference numerals are used for the same components in the drawings, and redundant descriptions of the same components will be omitted.

FIG. 1 is a block diagram illustrating a display device according to an embodiment of the present disclosure.

Referring to FIG. 1, a display device 10 according to an embodiment of the present disclosure may include a display panel PNL, a data driver DDV, a scan driver SDV and a controller CON.

The display panel PNL may include a plurality of pixels PX. The pixels PX may be arranged in a matrix configuration along a first direction D1 and a second direction D2 intersecting the first direction D1. For example, the second direction D2 may be perpendicular to the first direction D1. Each of the pixels PX may include a plurality of sub-pixels. For example, each of the pixels PX may include a first sub-pixel SPX1, a second sub-pixel SPX2 and a third sub-pixel SPX3. Each of the first sub-pixel SPX1, the second sub-pixel SPX2 and the third sub-pixel SPX3 may receive a data voltage DATA, a scan signal SCAN, a driving voltage ELVDD, a common voltage ELVSS and an initialization voltage VINT.

In an embodiment, the first sub-pixel SPX1 may receive the data voltage DATA through a second data line 1520. The second sub-pixel SPX2 may receive the data voltage DATA through a first data line 1510. The third sub-pixel SPX3 may receive the data voltage DATA through a third data line 1530. In addition, each of the first, second and third sub-pixels SPX1, SPX2 and SPX3 may receive the scan signal SCAN through scan lines 3200 and 3500. However, the present disclosure is not limited thereto.

The data driver DDV may generate the data voltage DATA based on an output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal and a load signal. In an embodiment, the data driver DDV may be mounted on the display panel PNL, or may be integrated in a peripheral part of the display panel PNL. In another embodiment, the data driver DDV may be implemented with one or more integrated circuits (ICs).

The scan driver SDV may generate the scan signal SCAN based on a scan control signal SCTRL. The scan signal SCAN may include a first scan signal (e.g., a first scan signal SC in FIG. 2) and a second scan signal (e.g., a second scan signal SS in FIG. 2). For example, each of the first scan signal SC and the second scan signal SS may include a gate-on voltage for turning on a transistor and a gate-off voltage for turning off the transistor. The scan control signal SCTRL may include a vertical start signal, a clock signal, or the like. In an embodiment, the scan driver SDV may be mounted on the display panel PNL, or may be integrated in the peripheral part of the display panel PNL. In another embodiment, the scan driver SDV may be implemented with one or more integrated circuits.

The controller CON (e.g., a timing controller (T-CON)) may receive an input image data IDAT and a control signal CTRL from an external host processor (e.g., GPU). For example, the input image data IDAT may be RGB data including red image data, green image data and blue image data. The control signal CTRL may include a vertical synchronization signal, a horizontal synchronization signal, an input data enable signal, a master clock signal, or the like. The controller CON may generate the data control signal DCTRL, the scan control signal GCTRL and the output image data ODAT based on the input image data IDAT and the control signal CTRL.

Figure 2:
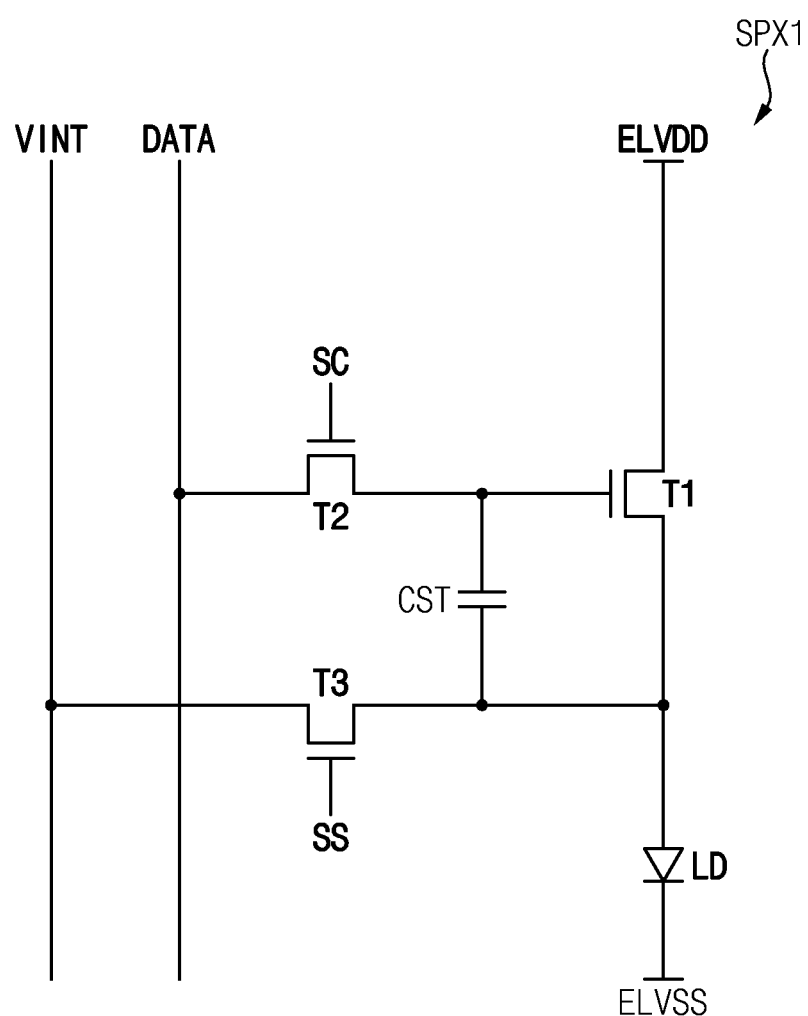
FIG. 2 is an equivalent circuit diagram of a sub-pixel included in the display device of FIG. 1.

FIG. 2 is an equivalent circuit diagram of a sub-pixel included in the display device of FIG. 1.

Referring to FIG. 2, the first sub-pixel SPX1 may include a first transistor T1, a second transistor T2, a third transistor T3, a storage capacitor CST and a light emitting element LD. Each of the second sub-pixel SPX2 and the third sub-pixel SPX3 may have substantially the same circuit structure as that of the first sub-pixel SPX1.

The first transistor T1 may include a first terminal, a second terminal and a gate terminal. The first terminal may receive the driving voltage ELVDD. The second terminal may be connected to the light emitting element LD. The gate terminal may be connected to the second transistor T2. The first transistor T1 may generate a driving current based on the driving voltage ELVDD and the data voltage DATA. For example, the first transistor T1 may be a driving transistor that drives the light emitting element LD.

The second transistor T2 may include a first terminal, a second terminal and a gate terminal. The first terminal may receive the data voltage DATA. The second terminal may be connected to the first transistor T1. The gate terminal may receive a first scan signal SC. The second transistor T2 may transmit the data voltage DATA in response to the first scan signal SC. For example, the second transistor T2 may be a switching transistor.

The third transistor T3 may include a first terminal, a second terminal and a gate terminal. The first terminal may be connected to the second terminal of the first transistor T1. The second terminal may receive the initialization voltage VINT. The gate terminal may receive a second scan signal SS. The third transistor T3 may transmit the initialization voltage VINT to the second terminal of the first transistor T1 in response to the second scan signal SS. For example, the third transistor T3 may be an initialization transistor.

The storage capacitor CST may include a first terminal and a second terminal. The first terminal may be connected to the gate terminal of the first transistor T1. The second terminal may be connected to the second terminal of the first transistor T1 and the first terminal of the third transistor T3. The storage capacitor CST may maintain a voltage level of the gate terminal of the first transistor T1 during an inactive period of the first scan signal SC.

The light emitting element LD may include a first terminal and a second terminal. The first terminal may be connected to the second terminal of the first transistor T1. The second terminal may receive the common voltage ELVSS. The light emitting element LD may emit light having luminance corresponding to the driving current. The light emitting element LD may include an organic light emitting element using an organic material as a light emitting layer, an inorganic light emitting element using an inorganic material as a light emitting layer, or the like.

Although FIG. 2 illustrates that one sub-pixel includes three transistors T1, T2 and T3, one storage capacitor CST and one light emitting element LD, the present disclosure is not limited thereto. For example, one sub-pixel may include at least one transistor, at least one storage capacitor and at least one light emitting element.

Figure 8:
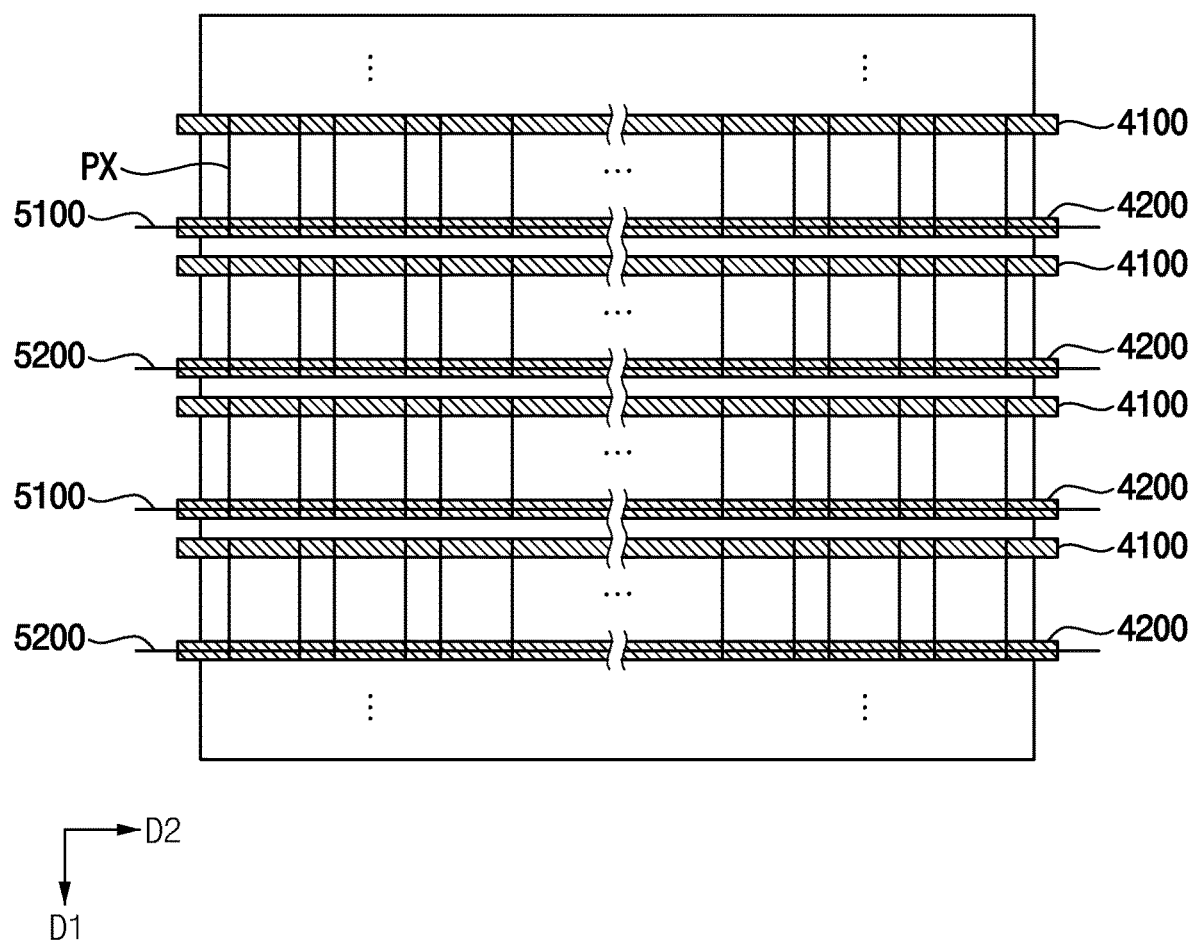
FIG. 8 is a plan view schematically illustrating the display device of FIG. 1.
Figure 9:
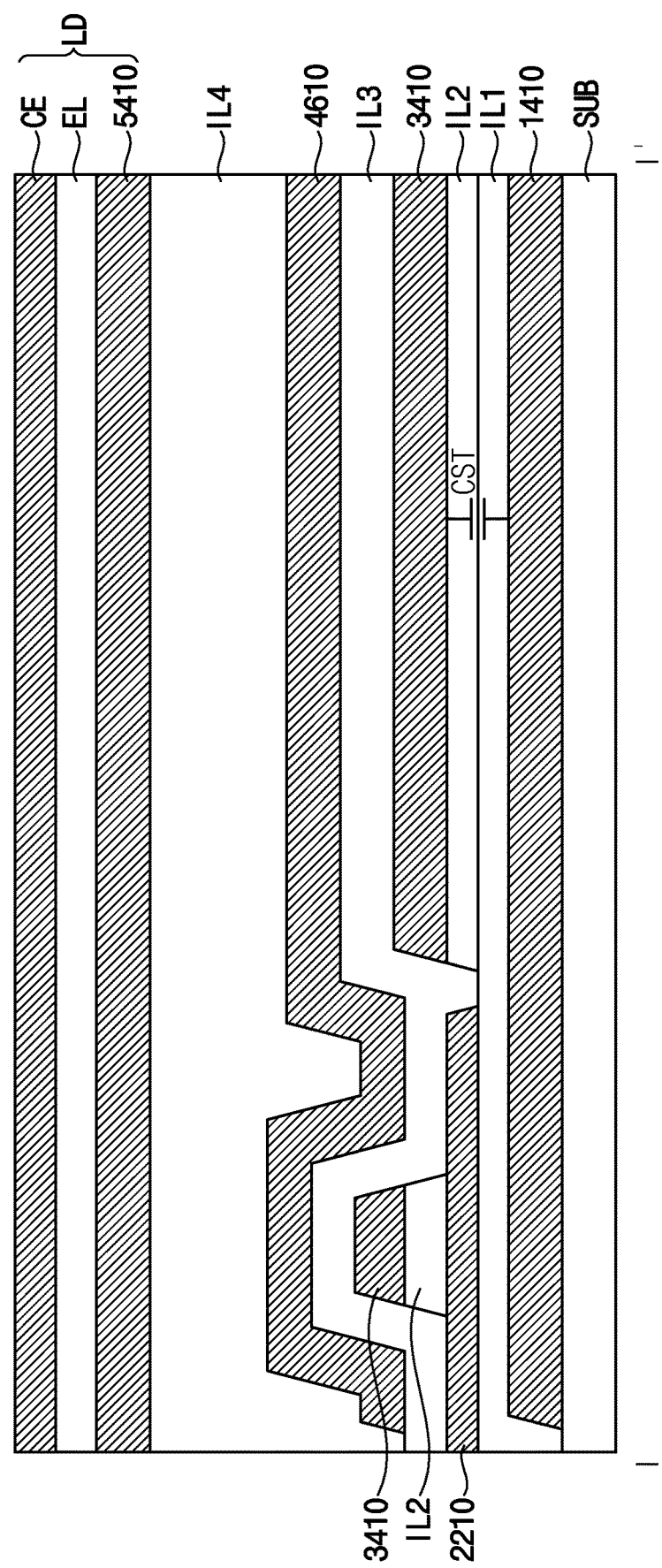
FIG. 9 is a cross-sectional view taken along line I-I' of FIG. 7.

FIGS. 3, 4, 5, 6 and 7 are layout views for explaining an example of a pixel included in the display device of FIG. 1. FIG. 8 is a plan view schematically illustrating the display device of FIG. 1. FIG. 9 is a cross-sectional view taken along line I-I' of FIG. 7.

For example, FIGS. 3, 4, 5, 6, 7, 8 and 9 may be views for explaining an example of a part of a plurality of conductive patterns included in the display device 10.

Figure 3:
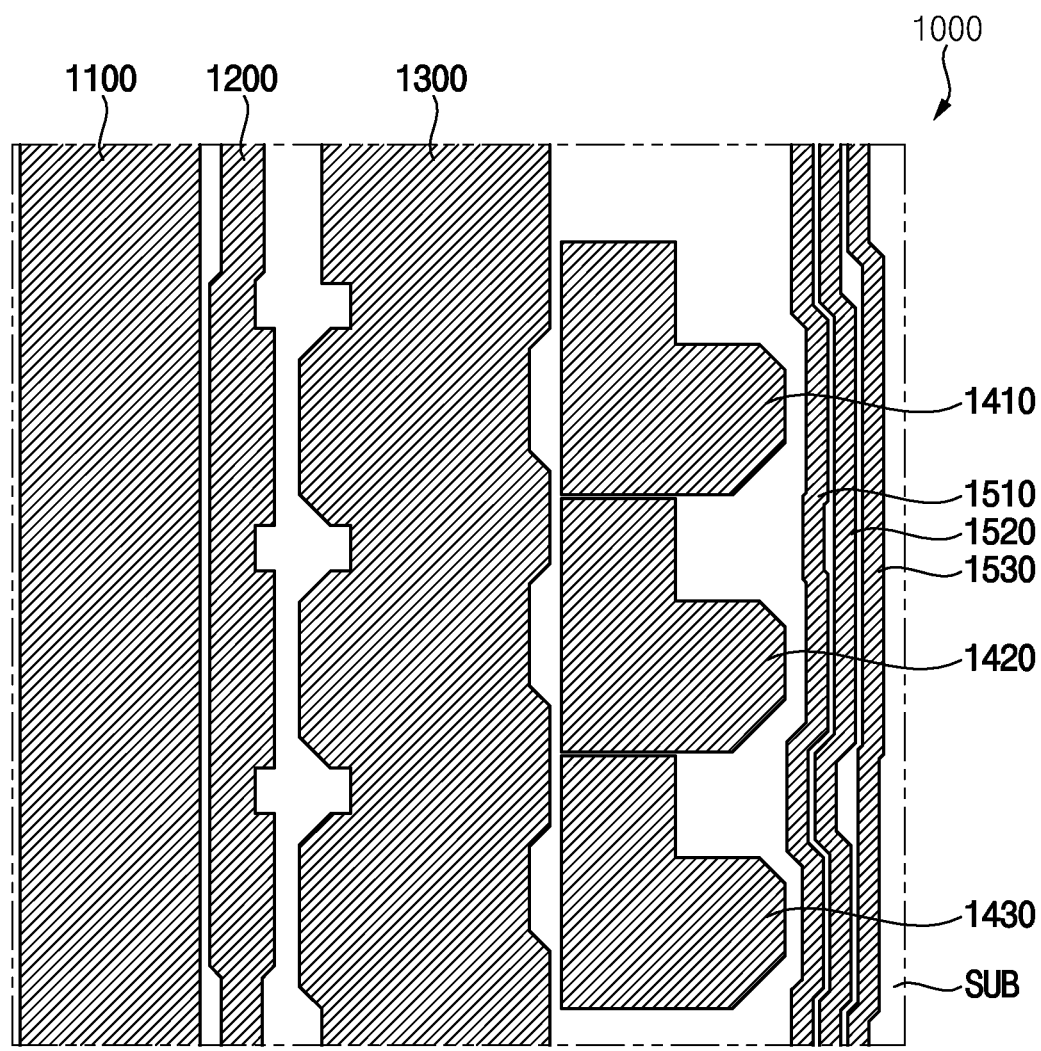
FIGS. 3, 4, 5, 6 and 7 are layout views for explaining an example of a pixel included in the display device of FIG. 1.
Figure 4:
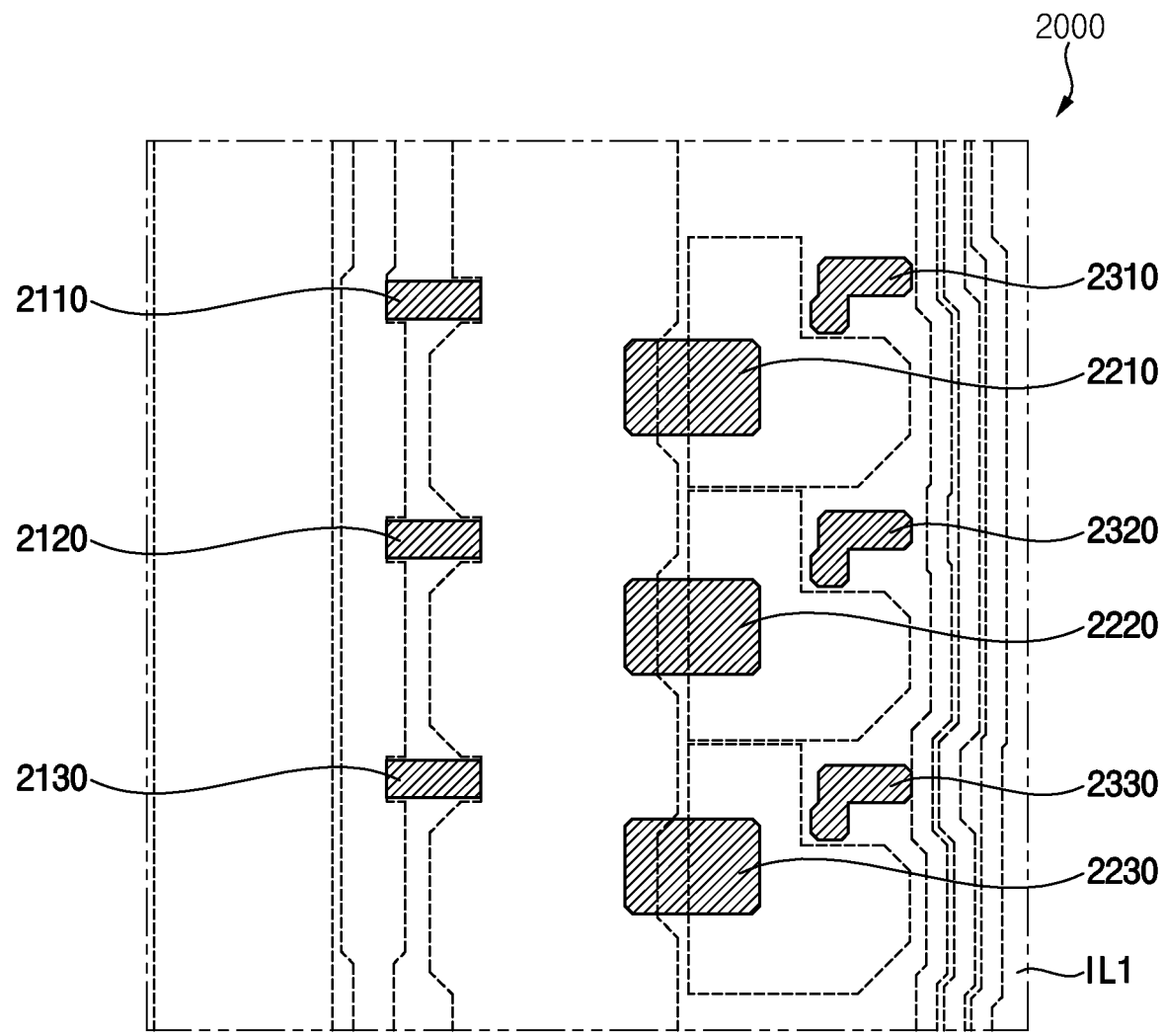
Figure 5:
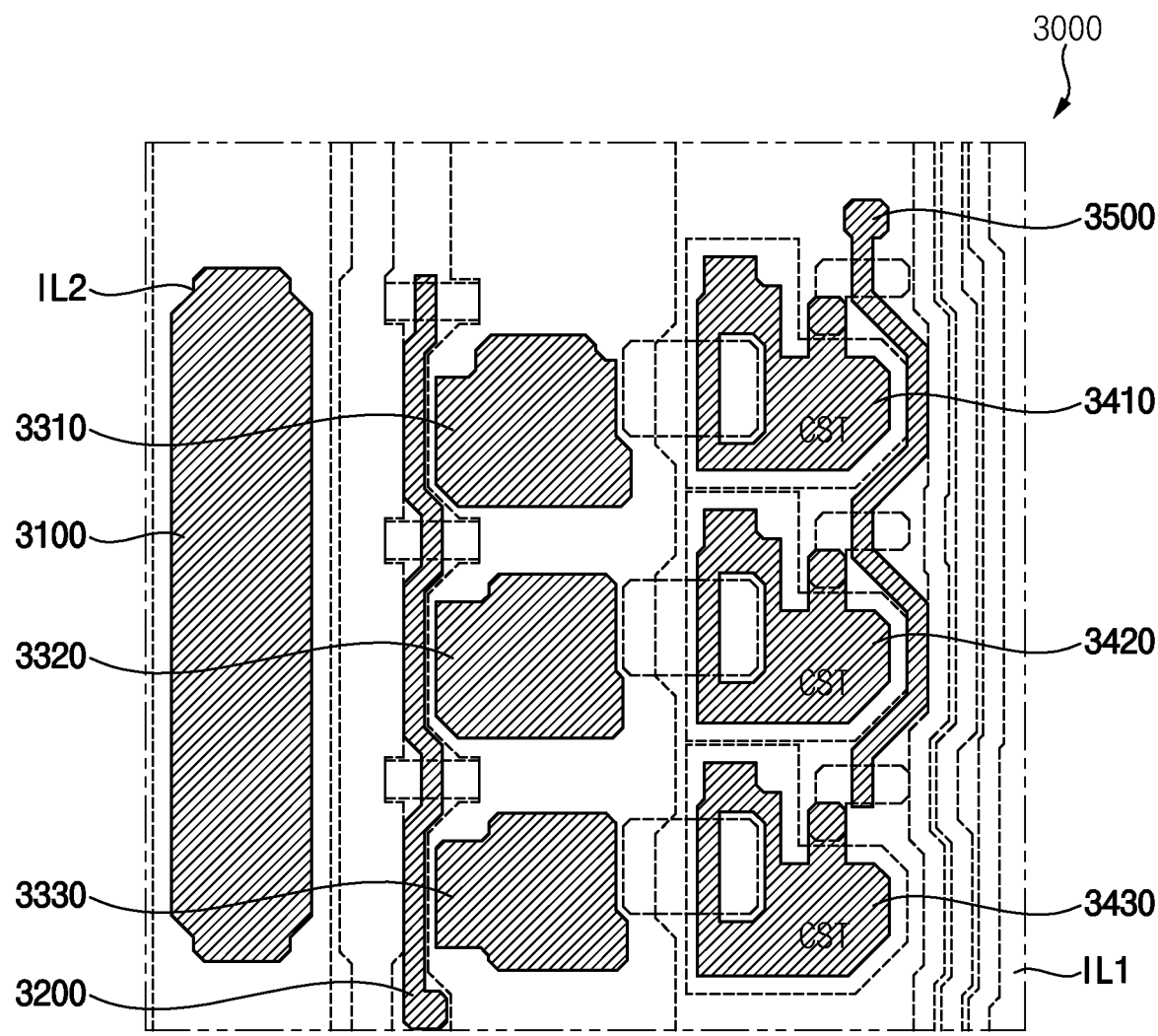
Figure 6:
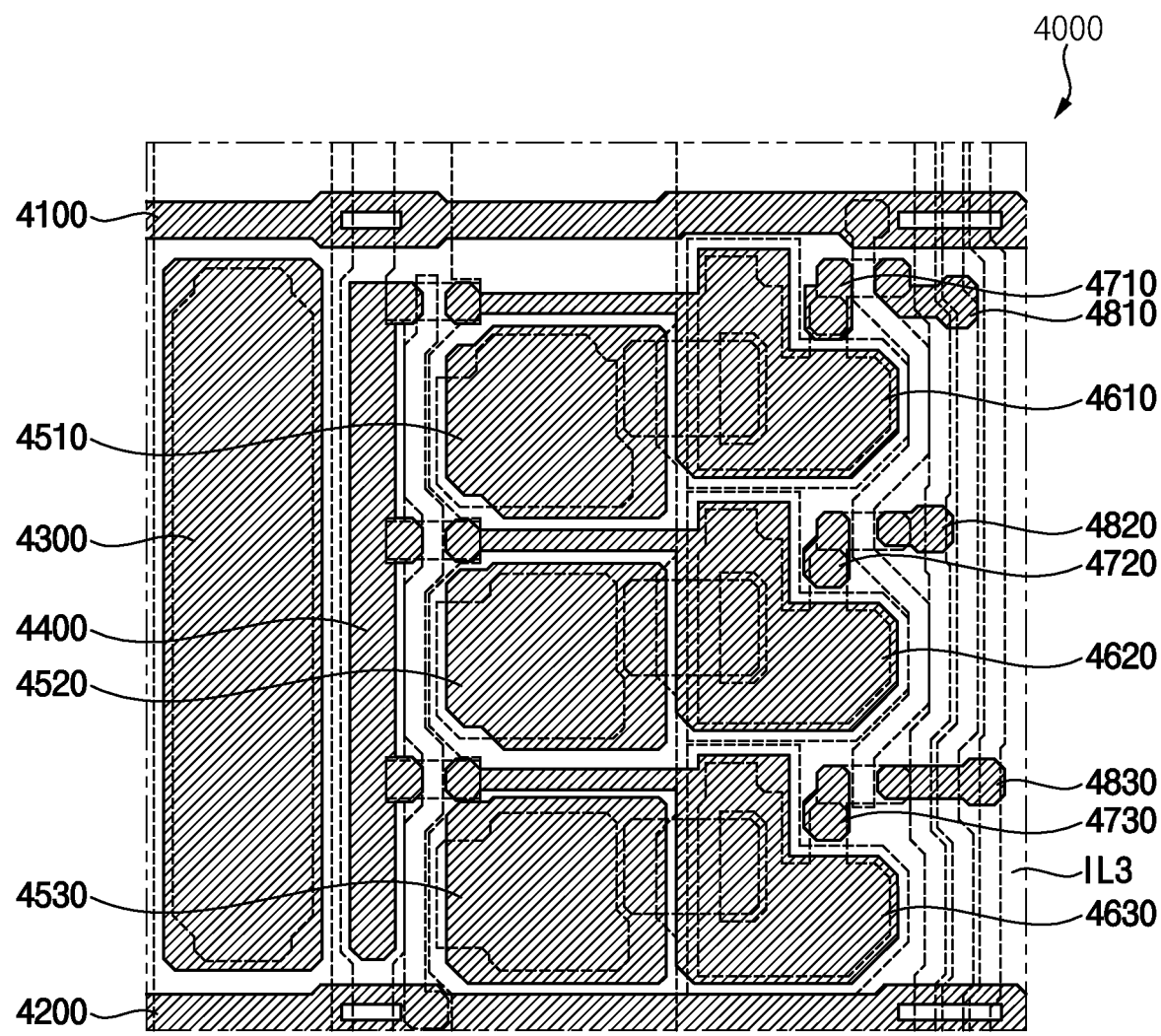
Figure 7:
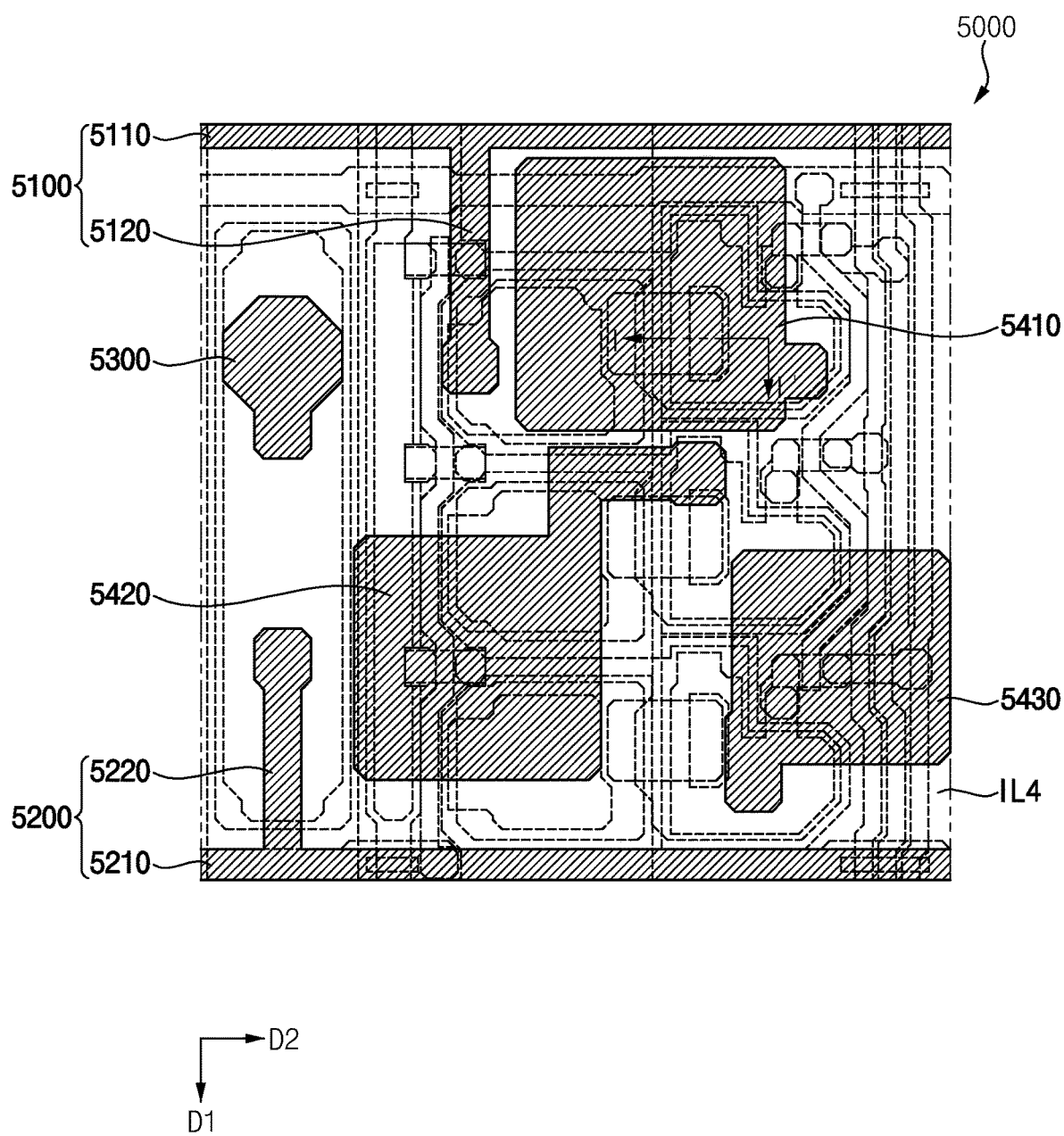

Referring to FIGS. 1, 3 and 9, the display device 10 may include a substrate SUB and a first conductive pattern 1000.

The substrate SUB may include a transparent material or an opaque material. In an embodiment, examples of materials that may be used as the substrate SUB may include glass, quartz, plastic, or the like. These may be used alone or in combination with each other.

The first conductive pattern 1000 may be disposed on the substrate SUB. The first conductive pattern 1000 may include a first common voltage line 1100, an initialization voltage line 1200, a first driving voltage line 1300, a first capacitor electrode 1410, a second capacitor electrode 1420, a third capacitor electrode 1430, the first data line 1510, the second data line 1520 and the third data line 1530.

The first common voltage line 1100 may extend in the first direction D1. The first common voltage line 1100 may provide the common voltage ELVSS to the first, second and third sub-pixels SPX1, SPX2 and SPX3.

The initialization voltage line 1200 may be disposed adjacent to the first common voltage line 1100 in the second direction D2, and may extend in the first direction D1. The initialization voltage line 1200 may provide the initialization voltage VINT to the first, second and third sub-pixels SPX1, SPX2 and SPX3.

The first driving voltage line 1300 may be disposed adjacent to the initialization voltage line 1200 in the second direction D2, and may extend in the first direction D1. The first driving voltage line 1300 may provide the driving voltage ELVDD to the first, second and third sub-pixels SPX1, SPX2 and SPX3.

The first, second and third capacitor electrodes 1410, 1420 and 1430 may be adjacent to the first driving voltage line 1300 in the second direction D2, and may be arranged along the first direction D1.

In an embodiment, the first capacitor electrode 1410 may be electrically connected to the initialization voltage line 1200. For example, the first capacitor electrode 1410 may 1410 may correspond to the second terminal of the storage capacitor CST included in the first sub-pixel SPX1 described with reference to FIG. 2.

In addition, the second capacitor electrode 1420 may be electrically connected to the initialization voltage line 1200. The third capacitor electrode 1430 may be electrically connected to the initialization voltage line 1200 through the third transistor T3.

The first data line 1510 may be disposed adjacent to the first, second and third capacitor electrodes 1410, 1420 and 1430 in the second direction D2, and may extend in the first direction D1. The first data line 1510 may provide the data voltage DATA to the second sub-pixel SPX2.

The second data line 1520 may be disposed adjacent to the first data line 1510 in the second direction D2, and may extend in the first direction D1. The second data line 1520 may 1520 may provide the data voltage DATA to the first sub-pixel SPX1.

The third data line 1530 may be disposed adjacent to the second data line 1520 in the second direction D2, and may extend in the first direction D1. The third data line 1530 may 1530 may provide the data voltage DATA to the third sub-pixel SPX3.

However, connection relationships between the first, second and third data lines 1510, 1520 and 1530 and the first, second and third sub-pixels SPX1, SPX2 and SPX3 are not limited thereto. The connection relationships between the first, second and third data lines 1510, 1520 and 1530 and the first, second and third sub-pixels SPX1, SPX2 and SPX3 may be appropriately altered as needed.

In an embodiment, the first conductive pattern 1000 may include a conductive material. Examples of conductive materials that may be used as the first conductive pattern 1000 may 1000 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other. In addition, the first conductive pattern 1000 may include a single layer or multiple layers.

Referring to FIGS. 1, 3, 4 and 9, a first insulating layer IL1 may be disposed on the first conductive pattern 1000, and may cover the first conductive pattern 1000.

The first insulating layer IL1 may prevent metal atoms or impurities from diffusing into a semiconductor pattern 2000 from the substrate SUB. In addition, the first insulating layer IL1 may control a thermal conductivity of the semiconductor pattern 2000 during a crystallization process for forming the semiconductor pattern 2000. The first insulating layer IL1 may include an inorganic insulating material. Examples of inorganic insulating materials that may be used as the first insulating layer IL1 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These may be used alone or in combination with each other.

The semiconductor pattern 2000 may be disposed on the first insulating layer IL1. The semiconductor pattern 2000 may include a first semiconductor pattern 2110, a second semiconductor pattern 2120, a third semiconductor pattern 2130, a fourth semiconductor pattern 2210, a fifth semiconductor pattern 2220, a sixth semiconductor pattern 2230, a first active pattern 2310, a second active pattern 2320 and a third active pattern 2330.

The first semiconductor pattern 2110, the second semiconductor pattern 2120 and the third semiconductor pattern 2130 may be arranged along the first direction D1.

In an embodiment, the first semiconductor pattern 2110 may be electrically connected to the initialization voltage line 1200, and may transmit the initialization voltage VINT to the first sub-pixel SPX1. For example, the first semiconductor pattern 2110 may correspond to the first terminal and the second terminal of the third transistor T3 included in the first sub-pixel SPX1 described with reference to FIG. 2.

In addition, the second semiconductor pattern 2120 may be electrically connected to the initialization voltage line 1200, and may transmit the initialization voltage VINT to the second sub-pixel SPX2. The third semiconductor pattern 2130 may be electrically connected to the initialization voltage line 1200, and may transmit the initialization voltage VINT to the third sub-pixel SPX3.

The fourth semiconductor pattern 2210, the fifth semiconductor pattern 2220 and the sixth semiconductor pattern 2230 may be arranged along the first direction D1. The fourth, fifth and sixth semiconductor patterns 2210, 2220 and 2230 may overlap the first, second and third capacitor electrodes 1410, 1420 and 1430, respectively.

In an embodiment, the fourth semiconductor pattern 2210 may be electrically connected to the first driving voltage line 1300, and may transmit the driving voltage ELVDD to the first sub-pixel SPX1. For example, the fourth semiconductor pattern 2210 may 2210 may correspond to the first terminal and the second terminal of the first transistor T1 included in the first sub-pixel SPX1 described with reference to FIG. 2.

In addition, the fifth semiconductor pattern 2220 may be electrically connected to the first driving voltage line 1300, and may transmit the driving voltage ELVDD to the second sub-pixel SPX2. The sixth semiconductor pattern 2230 may be electrically connected to the first driving voltage line 1300, and may transmit the driving voltage ELVDD to the third sub-pixel SPX3.

The first active pattern 2310, the second active pattern 2320 and the third active pattern 2330 may be arranged along the first direction D1.

In an embodiment, the first active pattern 2310 may be electrically connected to the second data line 1520, and may transmit the data voltage DATA to the first sub-pixel SPX1. For example, the first active pattern 2310 may correspond to the first terminal and the second terminal of the second transistor T2 included in the first sub-pixel SPX1 described with reference to FIG. 2.

In addition, the second active pattern 2320 may be electrically connected to the first data line 1510, and may transmit the data voltage DATA to the second sub-pixel SPX2. The third active pattern 2330 may be electrically connected to the third data line 1530, and may transmit the data voltage DATA to the third sub-pixel SPX3.

In an embodiment, the semiconductor pattern 2000 may include a silicon semiconductor material or an oxide semiconductor material. Examples of silicon semiconductor materials that may be used as the semiconductor pattern 2000 may include amorphous silicon, polycrystalline silicon, or the like. Examples of oxide semiconductor materials that may be used as the semiconductor pattern 2000 may include indium gallium zinc oxide (IGZO), indium tin zinc oxide (ITZO), or the like. These may be used alone or in combination with each other.

Referring to FIGS. 1, 2, 3, 4, 5 and 9, a second insulating layer IL2 may be disposed on the semiconductor pattern 2000. In an embodiment, the second insulating layer IL2 may include an inorganic insulating material. Examples of inorganic insulating materials that may be used as the second insulating layer IL2 may include silicon oxide, silicon nitride, silicon oxynitride, or the like. These may be used alone or in combination with each other.

A second conductive pattern 3000 may be disposed on the second insulating layer IL2. The second conductive pattern 3000 may entirely overlap the second insulating layer IL2. The second conductive pattern 3000 may include a first double electrode 3100, a first gate line 3500, a second double electrode 3310, a third double electrode 3320, a fourth double electrode 3330, a first gate electrode 3410, a second gate electrode 3420, a third gate electrode 3430 and a second gate line 3200.

The first double electrode 3100 may overlap the first common voltage line 1100. The first double electrode 3100 may be electrically connected to the first common voltage line 1100, and may reduce electrical resistance of the first common voltage line 1100. Accordingly, a voltage drop of the common voltage ELVSS may be prevented.

The second gate line 3200 may be disposed adjacent to the first double electrode 3100 in the second direction D2, and may extend in the first direction D1. The second gate line 3200 may overlap the first, second and third semiconductor patterns 2110, 2120 and 2130. The second gate line 3200 may provide the second scan signal SS to the first, second and third sub-pixels SPX1, SPX2 and SPX3.

The second, third and fourth double electrodes 3310, 3320 and 3330 may be disposed adjacent to the second gate line 3200 in the second direction D2, and may be arranged along the first direction D1. The second, third and fourth double electrodes 3310, 3320 and 3330 may overlap the first driving voltage line 1300. The second, third and fourth double electrodes 3310, 3320 and 3330 may be electrically connected to the first driving voltage line 1300, and may reduce electrical resistance of the first driving voltage line 1300. Accordingly, a voltage drop of the driving voltage ELVDD may be prevented.

The first, second and third gate electrodes 3410, 3420 and 3430 may be disposed adjacent to the second, third and fourth double electrodes 3310, 3320 and 3330 in the second direction D2, and may be arranged along the first direction D1.

In an embodiment, the first gate electrode 3410 may be electrically connected to the first active pattern 2310, and may overlap the fourth semiconductor pattern 2210. For example, the first gate electrode 3410 may correspond to the gate terminal of the first transistor T1 included in the first sub-pixel SPX1 described with reference to FIG. 2.

In addition, the second gate electrode 3420 may be electrically connected to the second active pattern 2320, and may overlap the fifth semiconductor pattern 2220. The third gate electrode 3430 may be electrically connected to the third active pattern 2330, and may overlap the sixth semiconductor pattern 2230.

In an embodiment, the first gate electrode 3410 may overlap the first capacitor electrode 1410. For example, the first gate electrode 3410 may correspond to the first terminal of the storage capacitor CST included in the first sub-pixel SPX1 described with reference to FIG. 2. That is, the first capacitor electrode 1410 and the first gate electrode 3410 may form the storage capacitor CST.

In addition, the second gate electrode 3420 may overlap the second capacitor electrode 1420, and may form the storage capacitor CST with the second capacitor electrode 1420. The third gate electrode 3430 may overlap the third capacitor electrode 1430, and may form the storage capacitor CST with the third capacitor electrode 1430.

The first gate line 3500 may be disposed adjacent to the first, second and third gate electrodes 3410, 3420 and 3430 in the second direction D2, and may extend in the first direction D1. The first gate line 3500 may overlap the first, second and third active patterns 2310, 2320 and 2330. The first gate line 3500 may provide the first scan signal SC to the first, second and third sub-pixels SPX1, SPX2 and SPX3. For example, the first gate line 3500 may correspond to the gate terminal of the second transistor T2 included in the first sub-pixel SPX1 described with reference to FIG. 2.

The second conductive pattern 3000 may include a conductive material. Examples of conductive materials that may be used as the second conductive pattern 3000 may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like. These may be used alone or in combination with each other. In addition, the second conductive pattern 3000 may include a single layer or multiple layers.

Referring to FIGS. 1, 2, 3, 4, 5, 6 and 9, a third insulating layer IL3 may be disposed on the second conductive pattern 3000, and may cover the second conductive pattern 3000. In an embodiment, the third insulating layer IL3 may include an inorganic insulating material. Examples of inorganic insulating materials that may be used as the third insulating layer IL3 may include silicon oxide, silicon nitride, silicon oxynitride, or the like. These may be used alone or in combination with each other.

A third conductive pattern 4000 may be disposed on the third insulating layer IL3. The third conductive pattern 4000 may include a first scan line 4100, a second scan line 4200, a common voltage connection electrode 4300, an initialization voltage connection electrode 4400, a first driving voltage connection electrode 4510, a second driving voltage connection electrode 4520, a third driving voltage connection electrode 4530, a first anode pad 4610, a second anode pad 4620, a third anode pad 4630, a first connection electrode 4710, a second connection electrode 4720, a third connection electrode 4730, a first data electrode 4810, a second data electrode 4820 and a third data electrode 4830.

The first scan line 4100 may extend in the second direction D2. The first scan line 4100 may contact the first gate line 3500 through at least one contact hole. The first scan line 4100 may be electrically connected to the first gate line 3500, and may transmit the first scan signal SC to the first gate line 3500.

The second scan line 4200 may be spaced apart from the first scan line 4100 in the first direction D1, and may extend in the second direction D2. The second scan line 4200 may 4200 may contact the second gate line 3200 through at least one contact hole. The second scan line 4200 may be electrically connected to the second gate line 3200, and may transmit the second scan signal SS to the second gate line 3200.

The common voltage connection electrode 4300 may be disposed between the first scan line 4100 and the second scan line 4200 in a plan view. The common voltage connection electrode 4300 may overlap the first common voltage line 1100 and the first double electrode 3100. The common voltage connection electrode 4300 may contact each of the first common voltage line 1100 and the first double electrode 3100 through at least one contact hole.

The initialization voltage connection electrode 4400 may be disposed adjacent to the common voltage connection electrode 4300 in the second direction D2. The initialization voltage connection electrode 4400 may overlap the initialization voltage line 1200. The initialization voltage connection electrode 4400 may contact each of the initialization voltage line 1200 and the first, second and third semiconductor patterns 2110, 2120 and 2130 through at least one contact hole. The initialization voltage connection electrode 4400 may transmit the initialization voltage VINT from the initialization voltage line 1200 to the first, second and third semiconductor patterns 2110, 2120 and 2130.

The first, second and third driving voltage connection electrodes 4510, 4520 and 4530 may be disposed adjacent to the initialization voltage connection electrode 4400 in the second direction D2, and may be arranged along the first direction D1. The first, second and third driving voltage connection electrodes 4510, 4520 and 4530 may overlap the first driving voltage line 1300.

The first driving voltage connection electrode 4510 may contact each of the first driving voltage line 1300, the fourth semiconductor pattern 2210 and the second double electrode 3310 through at least one contact hole. The first driving voltage connection electrode 4510 may transmit the driving voltage ELVDD from the first driving voltage line 1300 to the fourth semiconductor pattern 2210.

In addition, the second driving voltage connection electrode 4520 may contact each of the first driving voltage line 1300, the fifth semiconductor pattern 2220 and the third double electrode 3320 through at least one contact hole. The third driving voltage connection electrode 4530 may contact each of the first driving voltage line 1300, the sixth semiconductor pattern 2230 and the fourth double electrode 3330 through at least one contact hole.

The first, second and third anode pads 4610, 4620 and 4630 may be disposed adjacent to the first, second and third driving voltage connection electrodes 4510, 4520 and 4530 in the second direction D2, and may be arranged along the first direction D1.

The first anode pad 4610 may contact each of the first capacitor electrode 1410, the first semiconductor pattern 2110 and the fourth semiconductor pattern 2210 through at least one contact hole. The first anode pad 4610 may transmit the initialization voltage VINT from the first semiconductor pattern 2110 to the first capacitor electrode 1410.

In addition, the second anode pad 4620 may contact each of the second capacitor electrode 1420, the second semiconductor pattern 2120 and the fifth semiconductor pattern 2220 through at least one contact hole. The third anode pad 4630 may contact each of the third capacitor electrode 1430, the third semiconductor pattern 2130 and the sixth semiconductor pattern 2230 through at least one contact hole.

The first, second and third connection electrodes 4710, 4720 and 4730 may be disposed adjacent to the first, second and third anode pads 4610, 4620 and 4630 in the second direction D2, and may be arranged along the first direction D1.

The first connection electrode 4710 may overlap the first active pattern 2310 and the first gate electrode 3410. In addition, the first connection electrode 4710 may contact each of the first active pattern 2310 and the first gate electrode 3410 through at least one contact hole. The first connection electrode 4710 may transmit the data voltage DATA from the first active pattern 2310 to the first gate electrode 3410.

In addition, the second connection electrode 4720 may contact each of the second active pattern 2320 and the second gate electrode 3420 through at least one contact hole. The third connection electrode 4730 may contact each of the third active pattern 2330 and the third gate electrode 3430 through at least one contact hole.

The first, second and third data electrodes 4810, 4820 and 4830 may be disposed adjacent to the first, second and third connection electrodes 4710, 4720 and 4730 in the second direction D2, and may be arranged along the first direction D1.

The first data electrode 4810 may contact each of the second data line 1520 and the first active pattern 2310 through at least one contact hole. The first data electrode 4810 may 4810 may transmit the data voltage DATA from the second data line 1520 to the first active pattern 2310.

In addition, the second data electrode 4820 may contact each of the first data line 1510 and the second active pattern 2320 through at least one contact hole. The third data electrode 4830 may contact each of the third data line 1530 and the third active pattern 2330 through at least one contact hole.

The third conductive pattern 4000 may include a conductive material. Examples of conductive materials that may be used as the third conductive pattern 4000 may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like. These may be used alone or in combination with each other. In addition, the third conductive pattern 4000 may include a single layer or multiple layers.

Referring to FIGS. 1, 2, 3, 4, 5, 6, 7, 8 and 9, a fourth insulating layer IL4 may be disposed on the third conductive pattern 4000, and may cover the third conductive pattern 4000.

The fourth insulating layer IL4 may include an organic insulating material. Examples of organic insulating materials that may be used as the fourth insulating layer IL4 may include photoresist, polyacrylic resin, polyimide resin, acrylic resin, or the like.

A fourth conductive pattern 5000 may be disposed on the fourth insulating layer IL4. The fourth conductive pattern 5000 may include a second driving voltage line 5100, a second common voltage line 5200, a common voltage electrode 5300, a first pixel electrode 5410, a second pixel electrode 5420 and a third pixel electrode 5430.

The second driving voltage line 5100 may extend in the second direction D2. The second driving voltage line 5100 may overlap the first driving voltage line 1300. For example, the first driving voltage line 1300 and the second driving voltage line 5100 may form a mesh shape in the plan view. In addition, the second driving voltage line 5100 may contact the first driving voltage connection electrode 4510 through at least one contact hole. Accordingly, the second driving voltage line 5100 may transmit the driving voltage ELVDD to the first driving voltage line 1300.

In an embodiment, the second driving voltage line 5100 may include a first line portion 5110 extending in the second direction D2 and a first branch portion 5120 protruding from the first line portion 5110 in a direction substantially perpendicular to the first line portion 5110. For example, the first branch portion 5120 may protrude from the first line portion 5110 in the first direction D1, but the present disclosure is not limited thereto. The first branch portion 5120 may overlap the second double electrode 3310 and the first driving voltage connection electrode 4510. In addition, the first branch portion 5120 may overlap the first driving voltage line 1300. Specifically, the first branch portion 5120 may contact the first driving voltage connection electrode 4510 through at least one contact hole. That is, the second driving voltage line 5100 may be electrically connected to the first driving voltage line 1300 through the first branch portion 5120.

The second common voltage line 5200 may be disposed to be spaced apart from the second driving voltage line 5100 in the first direction D1, and may extend in the second direction D2. The second common voltage line 5200 may overlap the first common voltage line 1100. For example, the first common voltage line 1100 and the second common voltage line 5200 may form a mesh shape in the plan view. In addition, the second common voltage line 5200 may contact the common voltage connection electrode 4300 through at least one contact hole. Accordingly, the second common voltage line 5200 may transmit the common voltage ELVSS to the first common voltage line 1100 via the common voltage connection electrode 4300.

The second driving voltage line 5100 and the second common voltage line 5200 may 5200 may overlap the first, second and third data lines 1510, 1520 and 1530 in a plan view.

In an embodiment, the second common voltage line 5200 may include a second line portion 5210 extending in the second direction D2 and a second branch portion 5220 protruding from the second line portion 5210 in a direction substantially perpendicular to the second line portion 5210. For example, the second branch portion 5220 may protrude from the second line portion 5210 in a direction opposite to the first direction D1, but the present disclosure is not limited thereto. The second branch portion 5220 may overlap the first double electrode 3100 and the common voltage connection electrode 4300 in a plan view. In addition, the second branch portion 5220 may overlap the first common voltage line 1100 in a plan view. Specifically, the second branch 5220 may contact the common voltage connection electrode 4300 through at least one contact hole. That is, the second common voltage line 5200 may be electrically connected to the first common voltage line 1100 via the second branch portion 5220 and the common voltage connection electrode 4300.

In an embodiment, the second driving voltage line 5100 and the second common voltage line 5200 may be alternately disposed along the first direction D1. One of the second driving voltage line 5100 and the second common voltage line 5200 may be disposed in each of the pixels PX disposed along the first direction D1 (see FIG. 8). That is, the second driving voltage line 5100 may be disposed in each odd pixel row and the second common voltage line 5200 may be disposed in each even pixel row. The second driving voltage line 5100 may be disposed in each even pixel row and the second common voltage line 5200 may be disposed in each odd pixel row.

In an embodiment, the second scan line 4200 may entirely overlap at least one of the second driving voltage line 5100 and the second common voltage line 5200. In addition, the first scan line 4100 may not overlap each of the first line portion 5110 of the second driving voltage line 5100 and the second common voltage line 5200.

For example, the second scan line 4200 included in the pixels PX disposed in odd-numbered rows may overlap the second driving voltage line 5100 in a plan view, and the second scan line 4200 included in the pixels PX disposed in even-numbered rows may overlap the second common voltage line 5200 in a plan view. For another example, the second scan line 4200 included in the pixels PX disposed in the odd-numbered rows may overlap the second common voltage line 5200, and the second scan line 4200 included in the pixels PX disposed in the even-numbered rows may overlap the second driving voltage line 5100.

The common voltage electrode 5300 may be disposed between the second driving voltage line 5100 and the second common voltage line 5200 in the plan view. The common voltage electrode 5300 may overlap the common voltage connection electrode 4300. In addition, the common voltage electrode 5300 may contact the common voltage connection electrode 4300 through at least one contact hole. Accordingly, the common voltage ELVSS may be provided to the common voltage electrode 5300.

The first, second and third pixel electrodes 5410, 5420 and 5430 may be disposed between the second driving voltage line 5100 and the second common voltage line 5200 in the plan view. The first pixel electrode 5410 may contact the first anode pad 4610 through at least one contact hole. The second pixel electrode 5420 may contact the second anode pad 4620 through at least one contact hole. The third pixel electrode 5430 may contact the third anode pad 4630 through at least one contact hole. The first, second and third pixel electrodes 5410, 5420 and 5430 may receive the initialization voltage VINT or the driving current through the first, second and third anode pads 4610, 4620 and 4630, respectively.

The fourth conductive pattern 5000 may include a conductive material. Examples of conductive materials that may be used as the fourth conductive pattern 5000 may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like. These may be used alone or in combination with each other. In addition, the fourth conductive pattern 5000 may include a single layer or multiple layers.

A pixel defining layer may be disposed on the fourth conductive pattern 5000. The pixel defining layer may include openings that exposes at least a portion of each of the first, second and third pixel electrodes 5410, 5420 and 5430.

A light emitting layer EL may be disposed on the first, second and third pixel electrodes 5410, 5420 and 5430 and the pixel defining layer. Specifically, the light emitting layer EL may be disposed on the first, second and third pixel electrodes 5410, 5420 and 5430 respectively exposed by the openings, and may continuously extend. That is, the light emitting layer EL may be entirely formed on the display panel PNL shown in FIG. 1. For example, the light emitting layer EL may have a multilayer structure including a hole injection layer, a hole transport layer, an organic light emitting layer, an electron transport layer and an electron injection layer.

A common electrode CE may be disposed on the light emitting layer EL. The common electrode CE may continuously extend. That is, the common electrode CE may be entirely formed on the display panel PNL shown in FIG. 1. The common electrode CE may include a metal, an alloy, a conductive metal oxide, a transparent conductive material, or the like. These may be used alone or in combination with each other.

Each of the first, second and third pixel electrodes 5410, 5420 and 5430 may form the light emitting element LD with the light emitting layer EL and the common electrode CE.

In the display device 10 according to an embodiment of the present disclosure, the second driving voltage line 5100 and the second common voltage line 5200 may be disposed on the same layer as the first, second and third pixel electrodes 5410, 5420 and 5430. Accordingly, each parasitic capacitance between the second driving voltage line 5100 and the first, second and third data lines 1510, 1520 and 1530 and between the second common voltage line 5200 and the first, second and third data lines 1510, 1520 and 1530 may be reduced, and a sufficient space for the storage capacitor CST may be secured.

In addition, the second scan line 4200 may overlap at least one of the second driving voltage line 5100 and the second common voltage line 5200. As parasitic capacitance between the second scan line 4200 and at least one of the second driving voltage line 5100 and the second common voltage line 5200 increases, an interval between the first scan signal SC and the second scan signal SS may be secured.

Figure 10:
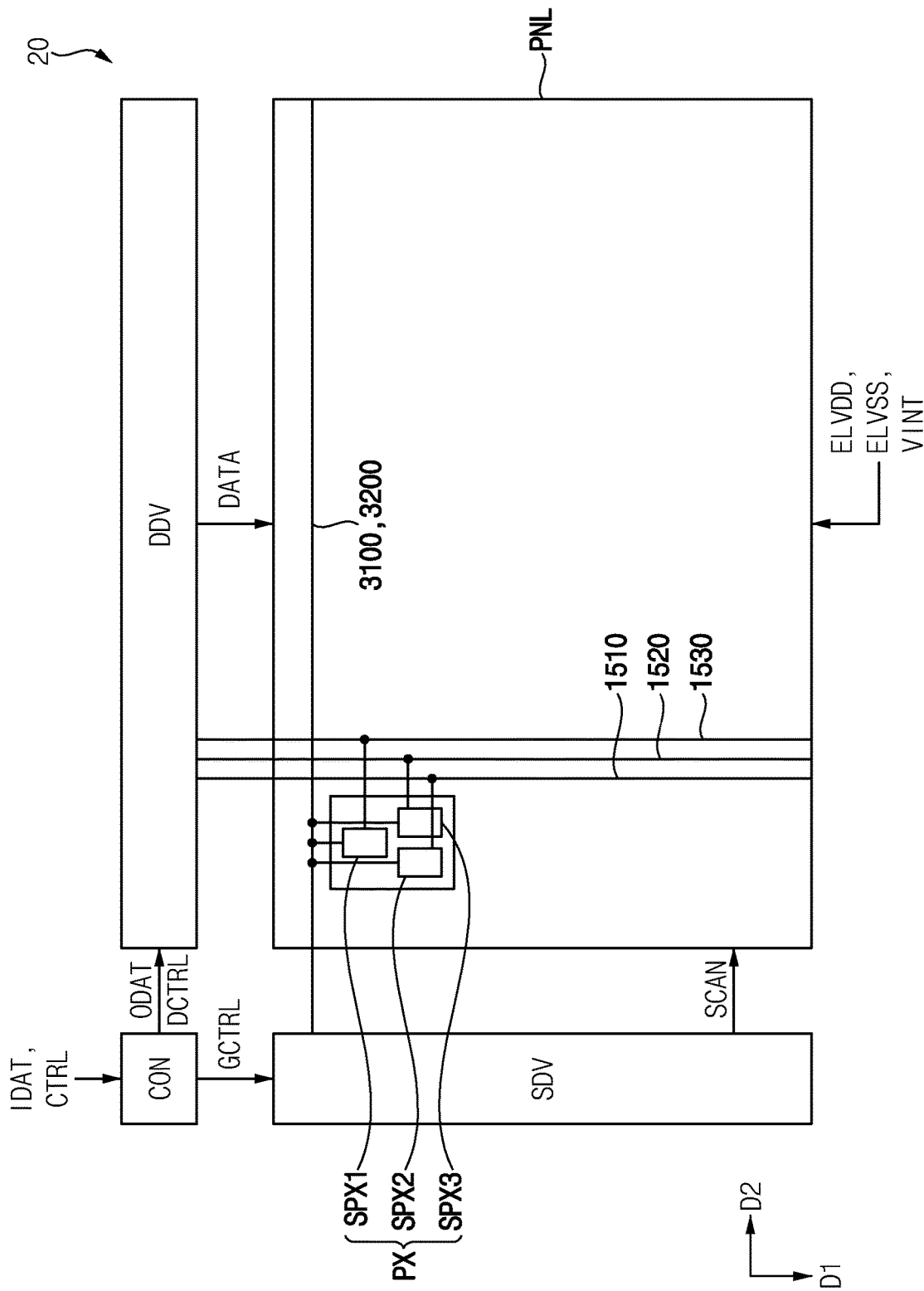
FIG. 10 is a block diagram illustrating a display device according to another embodiment of the present disclosure.

FIG. 10 is a block diagram illustrating a display device according to another embodiment of the present disclosure.

Hereinafter, descriptions overlapping those of the display device 10 described with reference to FIG. 1 will be omitted or simplified.

Referring to FIG. 10, a display device 20 according to another embodiment of the present disclosure may include the display panel PNL, the data driver DDV, the scan driver SDV and the controller CON.

In an embodiment, the first sub-pixel SPX1 may receive the data voltage DATA through the third data line 1530. The second sub-pixel SPX2 may receive the data voltage DATA through the first data line 1510. The third sub-pixel SPX3 may receive the data voltage DATA through the second data line 1520. In addition, each of the first, second and third sub-pixels SPX1, SPX2 and SPX3 may receive the scan signal SCAN through scan lines 3100 and 3200. However, the present disclosure is not limited thereto.

Figure 15:
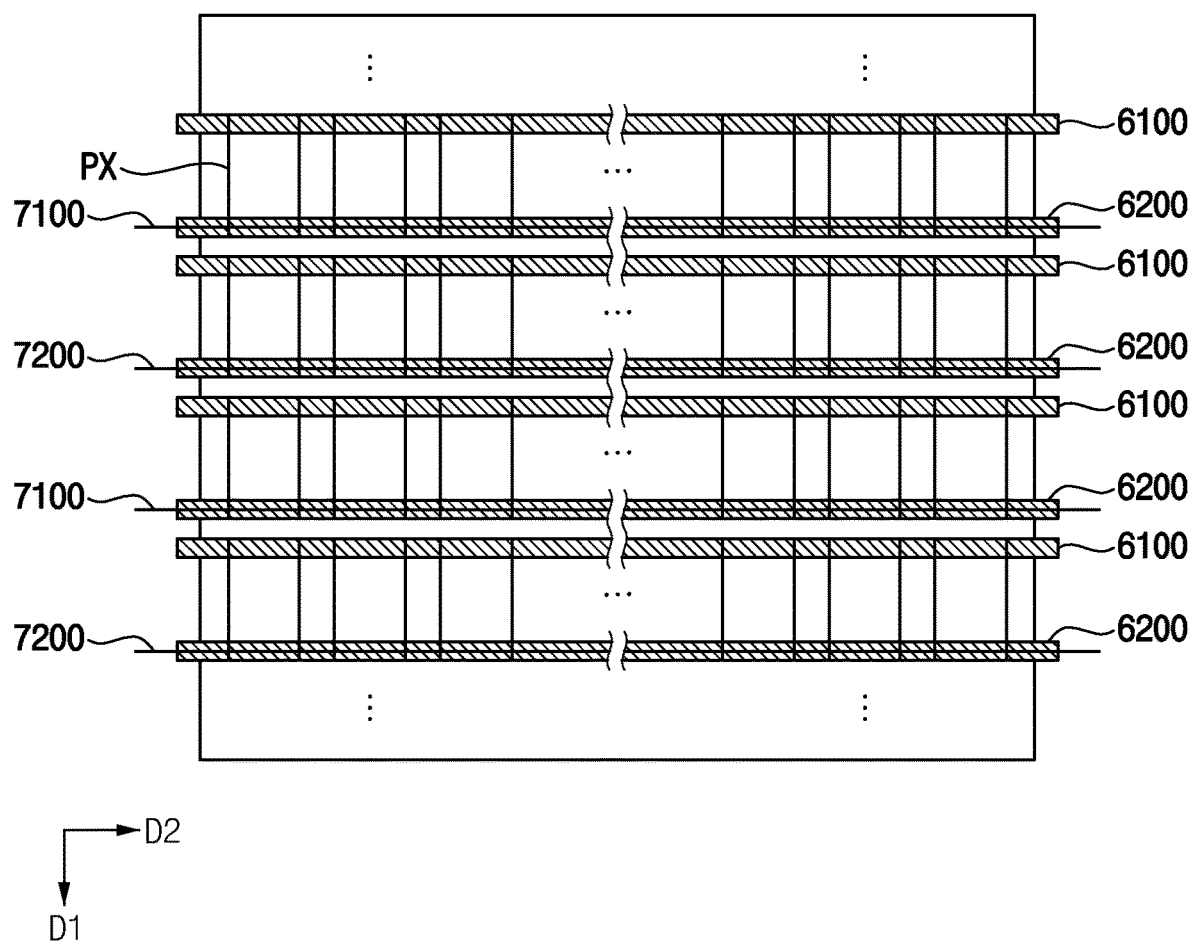
FIG. 15 is a plan view schematically illustrating the display device of FIG. 10.
Figure 16:
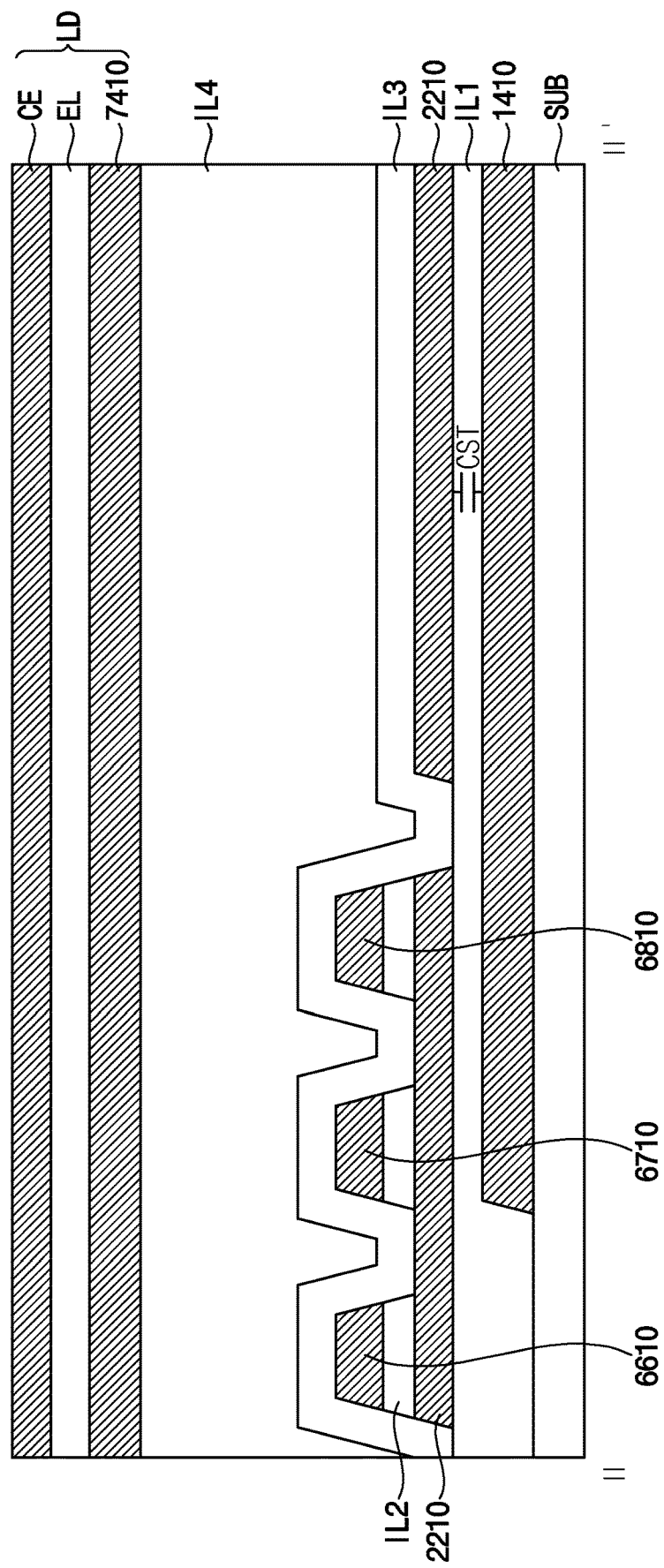
FIG. 16 is a cross-sectional view taken along line II-II' of FIG. 14.

FIGS. 11, 12, 13 and 14 are layout views for explaining an example of a pixel included in the display device of FIG. 10. FIG. 15 is a plan view schematically illustrating the display device of FIG. 10. FIG. 16 is a cross-sectional view taken along line II-II' of FIG. 14.

Hereinafter, descriptions overlapping those of the display device 10 described with reference to FIGS. 3, 4, 5, 6, 7, 8 and 9 will be omitted or simplified.

Figure 11:
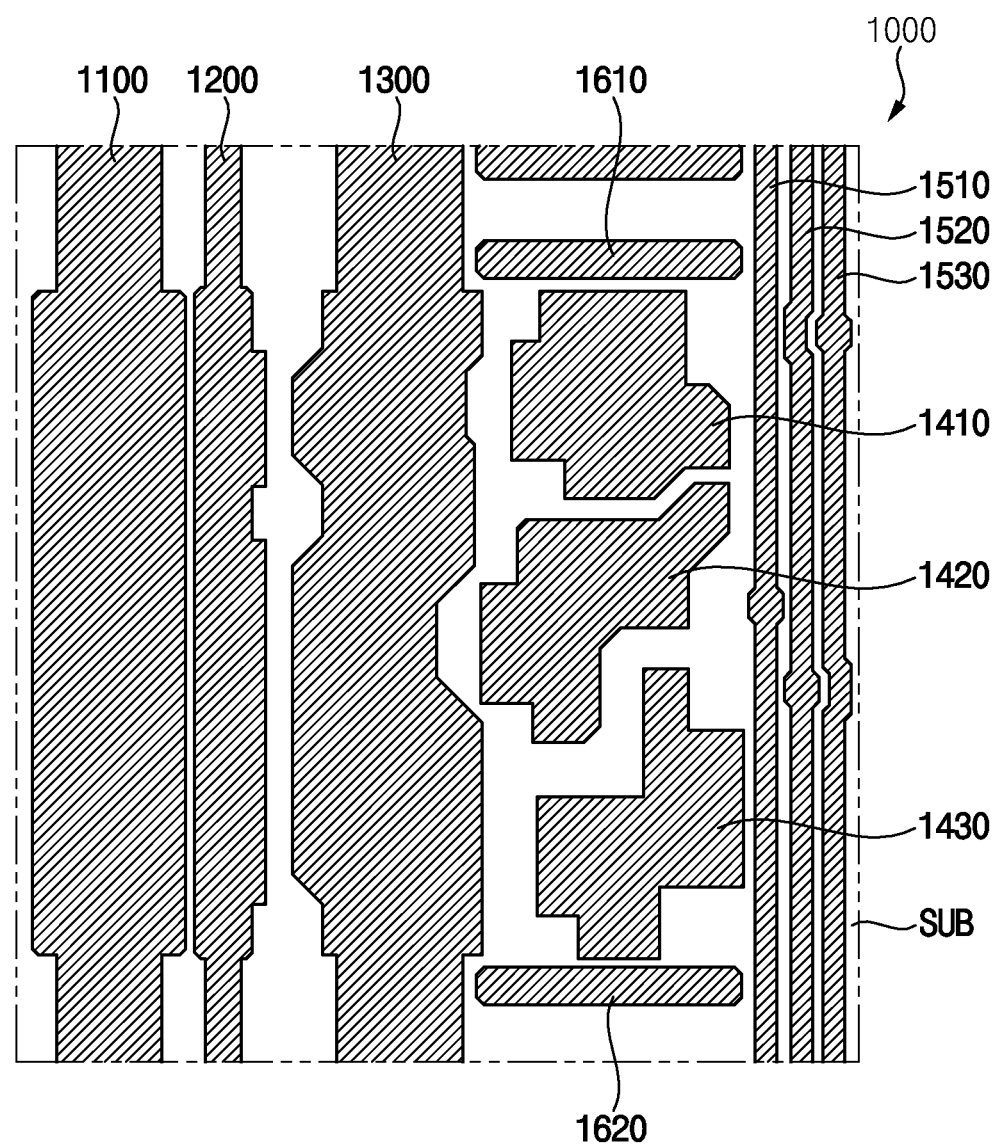
FIGS. 11, 12, 13 and 14 are layout views for explaining an example of a pixel included in the display device of FIG. 10.
Figure 12:
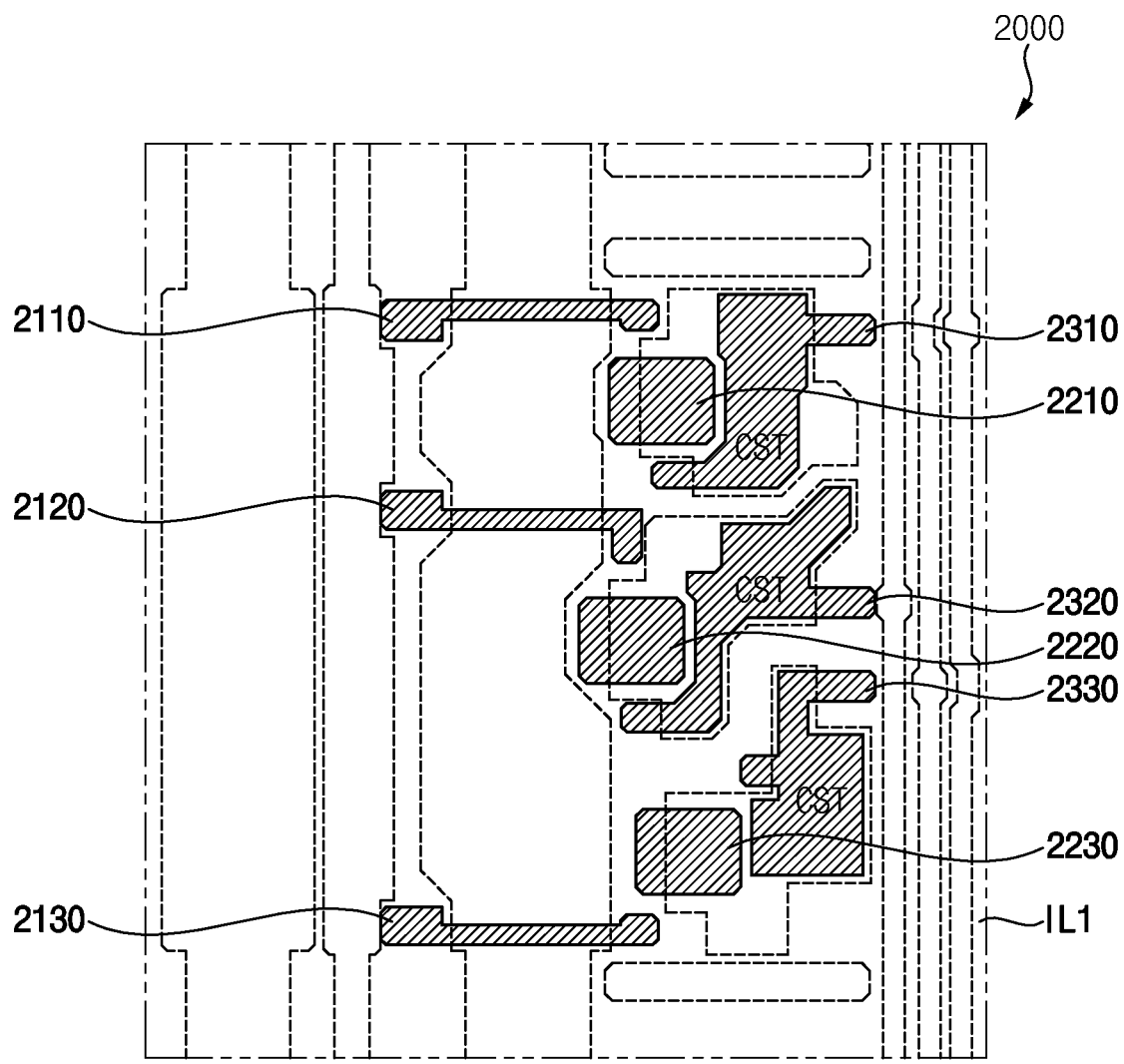
Figure 13:
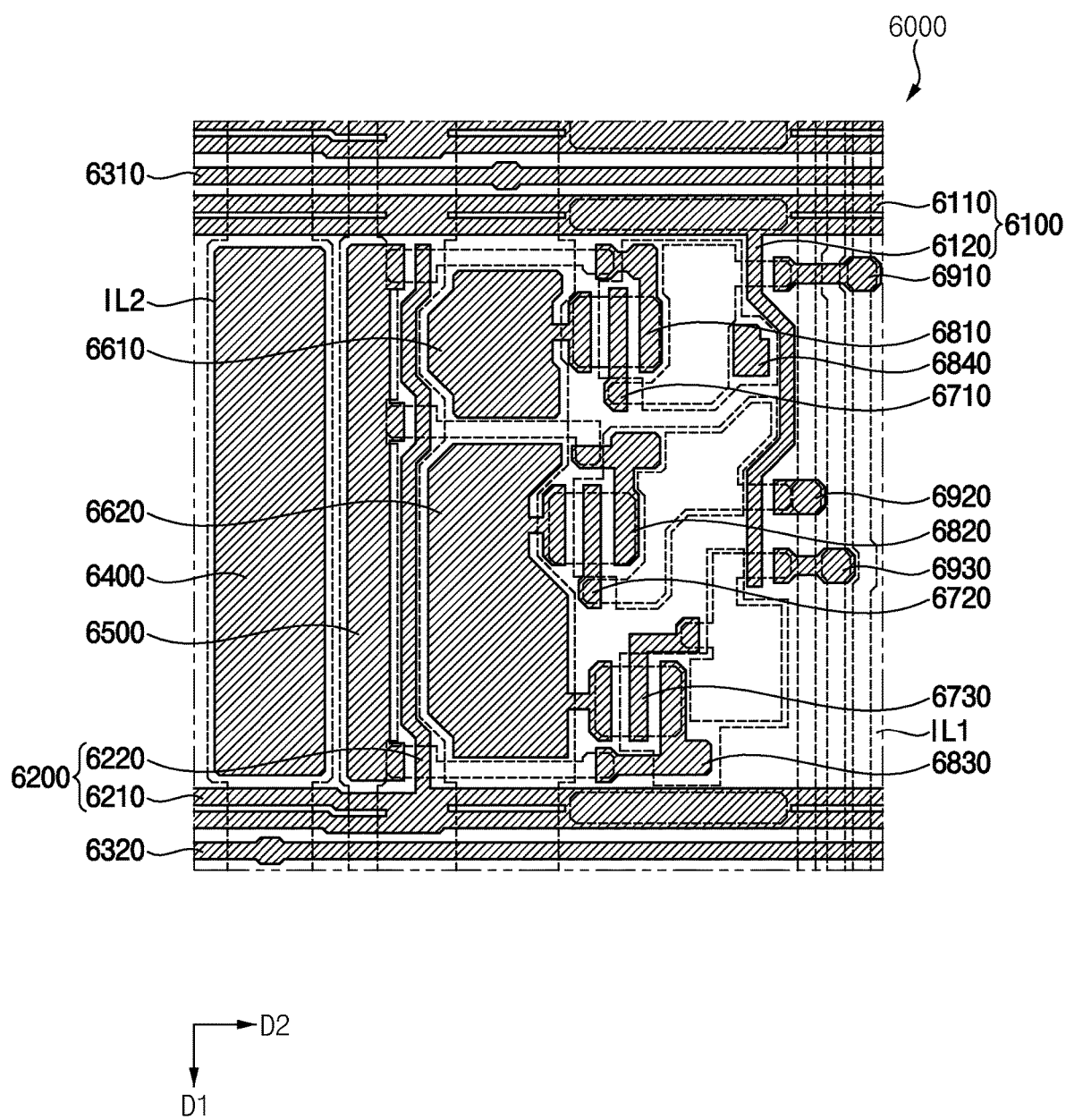
Figure 14:
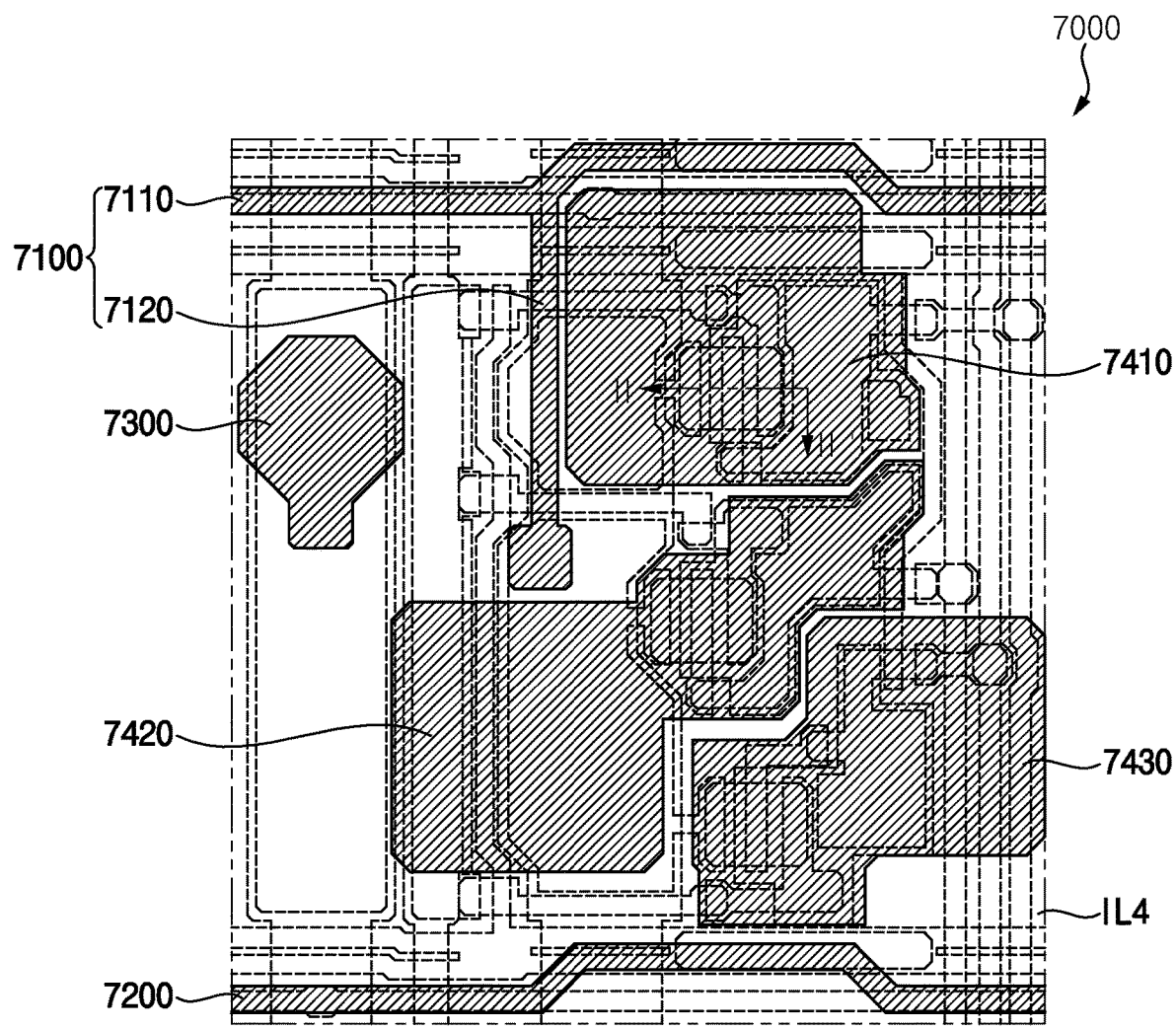

Referring to FIGS. 11 and 16, the display device 20 may include the substrate SUB and the first conductive pattern 1000.

The first conductive pattern 1000 may be disposed on the substrate SUB. The first conductive pattern 1000 may include the first common voltage line 1100, the initialization voltage line 1200, the first driving voltage line 1300, the first capacitor electrode 1410, the second capacitor electrode 1420, the third capacitor electrode 1430, the first data line 1510, the second data line 1520, the third data line 1530, a first lower electrode 1610 and a second lower electrode 1620.

Each of the first and second lower electrodes 1610 and 1620 may be disposed between the first driving voltage line 1300 and the first data line 1510 in the plan view. In addition, the second lower electrode 1620 may be disposed to be spaced apart from the first lower electrode 1610 in the first direction D1. Specifically, the first lower electrode 1610 may be disposed adjacent to the first capacitor electrode 1410 in the direction opposite to the first direction D1, and the second lower electrode 1620 may be adjacent to the third capacitor electrode 1430 in the first direction D1.

Referring to FIGS. 10, 11, 12 and 16, the first insulating layer IL1 and the semiconductor pattern 2000 may be sequentially disposed on the first conductive pattern 1000.

The semiconductor pattern 2000 may include the first semiconductor pattern 2110, the second semiconductor pattern 2120, the third semiconductor pattern 2130, the fourth semiconductor pattern 2210, the fifth semiconductor pattern 2220, the sixth semiconductor pattern 2230, the first active pattern 2310, the second active pattern 2320 and the third active pattern 2330.

In an embodiment, the first active pattern 2310 may overlap the first capacitor electrode 1410. For example, the first active pattern 2310 and the first capacitor electrode 1410 may respectively correspond to a first terminal and a second terminal of a storage capacitor included in the first sub-pixel SPX1 shown in FIG. 10. That is, the first capacitor electrode 1410 and the first active pattern 2310 may form the storage capacitor CST.

In addition, the second active pattern 2320 may overlap the second capacitor electrode 1420, and may form the storage capacitor CST. The third active pattern 2330 may overlap the third capacitor electrode 1430, and may form the storage capacitor CST.

Referring to FIGS. 10, 11, 12, 13 and 16, the second insulating layer IL2 and a second conductive pattern 6000 may be sequentially disposed on the semiconductor pattern 2000.

The second conductive pattern 6000 may entirely overlap the second insulating layer IL2. The second conductive pattern 6000 may include a first scan line 6100, a second scan line 6200, a first auxiliary line 6310, a second auxiliary line 6320, a common voltage connection electrode 6400, an initialization voltage connection electrode 6500, a first driving voltage connection electrode 6610, a second driving voltage connection electrode 6620, a first gate electrode 6710, a second gate electrode 6720, a third gate electrode 6730, a first anode pad 6810, a second anode pad 6820, a third anode pad 6830, a fourth anode pad 6840, a first data electrode 6910, a second data electrode 6920 and a third data electrode 6930.

The first scan line 6100 may extend in the second direction D2. In an embodiment, the first scan line 6100 may include a first line portion 6110 extending in the second direction D2 and a first branch portion 6120 protruding from the first line portion 6110. For example, the first branch portion 6120 may protrude from the first line portion 6110 in the first direction D1.

The first branch portion 6120 of the first scan line 6100 may overlap the first, second and third active patterns 2310, 2320 and 2330. The first scan line 6100 may provide the first scan signal SC to the first, second and third sub-pixels SPX1, SPX2 and SPX3.

The second scan line 6200 may be spaced apart from the first scan line 6100 in the first direction D1, and may extend in the second direction D2. In an embodiment, the second scan line 6200 may include a second line portion 6210 extending in the second direction D2 and a second branch portion 6220 protruding from the second line portion 6210. For example, the second branch portion 6220 may protrude from the second line portion 6210 in the direction opposite to the first direction D1.

The second branch portion 6220 of the second scan line 6200 may overlap the first, second and third semiconductor patterns 2110, 2120 and 2130. The second scan line 6200 may 6200 may provide the second scan signal SS to the first, second and third sub-pixels SPX1, SPX2 and SPX3.

Each of the first and second auxiliary lines 6310 and 6320 may extend in the second direction D2. The second auxiliary line 6320 may be spaced apart from the first auxiliary line 6310 in the first direction D1. Specifically, the first auxiliary line 6310 may be disposed adjacent to the first scan line 6100 in the direction opposite to the first direction D1, and the second auxiliary line 6320 may be disposed adjacent to the second scan line 6200 in the first direction D1. The first auxiliary line 6310 may be electrically connected to the first driving voltage line 1300, and the second auxiliary line 6320 may be electrically connected to the first common voltage line 1100.

The common voltage connection electrode 6400 may be disposed between the first line portion 6110 of the first scan line 6100 and the second line portion 6210 of the second scan line 6200 in the plan view. The common voltage connection electrode 6400 may overlap the first common voltage line 1100. The common voltage connection electrode 6400 may contact the first common voltage line 1100 through at least one contact hole.

The initialization voltage connection electrode 6500 may be disposed adjacent to the common voltage connection electrode 6400 in the second direction D2. The initialization voltage connection electrode 6500 may overlap the initialization voltage line 1200. The initialization voltage connection electrode 6500 may contact each of the initialization voltage line 1200 and the first, second and third semiconductor patterns 2110, 2120 and 2130 through at least one contact hole. The initialization voltage connection electrode 6500 may transmit the initialization voltage VINT from the initialization voltage line 1200 to the first, second and third semiconductor patterns 2110, 2120 and 2130.

The first and second driving voltage connection electrodes 6610 and 6620 may be disposed adjacent to the initialization voltage connection electrode 6500 in the second direction D2, and may be arranged along the first direction D1. The first and second driving voltage connection electrodes 6610 and 6620 may overlap the first driving voltage line 1300.

The first driving voltage connection electrode 6610 may contact each of the first driving voltage line 1300 and the fourth semiconductor pattern 2210 through at least one contact hole. The first driving voltage connection electrode 6610 may transmit the driving voltage ELVDD from the first driving voltage line 1300 to the fourth semiconductor pattern 2210.

In addition, the second driving voltage connection electrode 6620 may contact each of the first driving voltage line 1300, the fifth semiconductor pattern 2220 and the sixth semiconductor pattern 2230 through at least one contact hole.

The first, second and third gate electrodes 6710, 6720, and 6730 may be disposed adjacent to the first and second driving voltage connection electrodes 6610 and 6620 in the second direction D2, and may be arranged along the first direction D1.

The first gate electrode 6710 may be electrically connected to the first active pattern 2310, and may overlap the fourth semiconductor pattern 2210. The second gate electrode 6720 may be electrically connected to the second active pattern 2320, and may overlap the fifth semiconductor pattern 2220. The third gate electrode 6730 may be electrically connected to the third active pattern 2330, and may overlap the sixth semiconductor pattern 2230.

The first, second and third anode pads 6810, 6820 and 6830 may be disposed adjacent to the first and second driving voltage connection electrodes 6610 and 6620 in the second direction D2, and may be arranged along the first direction D1. The fourth anode pad 6840 may 6840 may be disposed adjacent to the first anode pad 6810 in the second direction D2.

The first anode pad 6810 may contact each of the first semiconductor pattern 2110 and the fourth semiconductor pattern 2210 through at least one contact hole. The fourth anode pad 6840 may contact the first capacitor electrode 1410 through at least one contact hole. The first and fourth anode pads 6810 and 6840 may transmit the initialization voltage VINT from the first semiconductor pattern 2110 to the first capacitor electrode 1410.

In addition, the second anode pad 6820 may contact each of the second capacitor electrode 1420, the second semiconductor pattern 2120 and the fifth semiconductor pattern 2220 through at least one contact hole. The third anode pad 6830 may contact each of the third capacitor electrode 1430, the third semiconductor pattern 2130 and the sixth semiconductor pattern 2230 through at least one contact hole.

The first, second and third data electrodes 6910, 6920 and 6930 may be disposed adjacent to the first, second and third anode pads 6810, 6820 and 6830 in the second direction D2, and may be arranged along the first direction D1.

The first data electrode 6910 may contact each of the third data line 1530 and the first active pattern 2310 through at least one contact hole. The first data electrode 6910 may transmit the data voltage DATA from the third data line 1530 to the first active pattern 2310.

In addition, the second data electrode 6920 may contact each of the first data line 1510 and the second active pattern 2320 through at least one contact hole. The third data electrode 6930 may contact each of the second data line 1520 and the third active pattern 2330 through at least one contact hole.

Referring to FIGS. 10, 11, 12, 13, 14, 15 and 16, the third insulating layer IL3, the fourth insulating layer IL4 and a third conductive pattern 7000 may be sequentially disposed on the second conductive pattern 6000. In an embodiment, the third insulating layer IL3 may be omitted.

The third conductive pattern 7000 may include a second driving voltage line 7100, a second common voltage line 7200, a common voltage electrode 7300, a first pixel electrode 7410, a second pixel electrode 7420 and a third pixel electrode 7430.

The second driving voltage line 7100 may extend in the second direction D2. The second driving voltage line 7100 may overlap the first driving voltage line 1300. In an embodiment, the second driving voltage line 7100 may include a first line portion 7110 extending in the second direction D2 and a first branch portion 7120 protruding from the first line portion 7110 in a direction substantially perpendicular to the first line portion 7110. For example, the first branch portion 7120 may protrude from the first line portion 7110 in the first direction D1, but the present disclosure is not limited thereto. The second driving voltage line 7100 may be electrically connected to the first driving voltage line 1300 through the first branch portion 7120.

The second common voltage line 7200 may be disposed to be spaced apart from the second driving voltage line 7100 in the first direction D1, and may extend in the second direction D2. The second common voltage line 7200 may be electrically connected to the first common voltage line 1100.

In an embodiment, the second driving voltage line 7100 and the second common voltage line 7200 may be alternately disposed along the first direction D1 (see FIG. 15).

In an embodiment, the second scan line 6200 may entirely overlap at least one of the second driving voltage line 7100 and the second common voltage line 7200. In addition, the first scan line 6100 may not overlap each of the first line portion 7110 of the second driving voltage line 7100 and the second common voltage line 7200.

For example, the second scan line 6200 included in the pixels PX disposed in odd-numbered rows may overlap the second driving voltage line 7100, and the second scan line 6200 included in the pixels PX disposed in even-numbered rows may overlap the second common voltage line 7200. For another example, the second scan line 6200 included in the pixels PX disposed in the odd-numbered rows may overlap the second common voltage line 7200, and the second scan line 6200 included in the pixels PX disposed in the even-numbered rows may overlap the second driving voltage line 7100.

The common voltage electrode 7300 may be disposed between the second driving voltage line 7100 and the second common voltage line 7200 in the plan view. The common voltage electrode 7300 may contact the common voltage connection electrode 6400 through at least one contact hole.

The first, second and third pixel electrodes 7410, 7420 and 7430 may be disposed between the second driving voltage line 7100 and the second common voltage line 7200 in the plan view. The first pixel electrode 7410 may contact the fourth anode pad 6840 through at least one contact hole. The second pixel electrode 7420 may contact the second anode pad 6820 through at least one contact hole. The third pixel electrode 7430 may contact the third anode pad 6830 through at least one contact hole.

The pixel defining layer, the light emitting layer EL and the common electrode CE may be sequentially disposed on the third conductive pattern 7000. Each of the first, second and third pixel electrodes 7410, 7420 and 7430 may form a light emitting element with the light emitting layer EL and the common electrode CE.

In the display device 20 according to another embodiment of the present disclosure, the second driving voltage line 7100 and the second common voltage line 7200 may be disposed on the same layer as the first, second and third pixel electrodes 1510, 1520 and 1530. Accordingly, each parasitic capacitance between the second driving voltage line 7100 and the first, second and third data lines 1510, 1520 and 1530 and between the second common voltage line 7200 and the first, second and third data lines 1510, 1520 and 1530 may be reduced, and a sufficient space of the storage capacitor CST may be secured.

In addition, the second scan line 6200 may overlap at least one of the second driving voltage line 7100 and the second common voltage line 7200. As parasitic capacitance between the second scan line 6200 and at least one of the second driving voltage line 7100 and the second common voltage line 7200 increases, an interval between the first scan signal SC and the second scan signal SS may be secured.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a substrate;
   a first conductive layer disposed on the substrate and including a data line extending in a first direction;
   a second conductive layer disposed on the first conductive layer and including:
   a first scan line extending in a second direction intersecting the first direction; and
   a second scan line spaced apart from the first scan line and extending in the second direction; and
   a third conductive layer disposed on the second conductive layer and including:
   a first driving voltage line extending in the second direction;
   a first common voltage line spaced apart from the first driving voltage line and extending in the second direction; and
   a pixel electrode disposed between the first driving voltage line and the first common voltage line in a plan view.

2. The display device of claim 1, wherein the second scan line overlaps at least one of the first driving voltage line and the first common voltage line in the plan view.

3. The display device of claim 1, wherein the first scan line does not overlap the first driving voltage line and the first common voltage line in the plan view.

4. The display device of claim 1, wherein the first driving voltage line and the first common voltage line are alternately disposed along the first direction.

5. The display device of claim 1, wherein the first conductive layer further includes:
   a second common voltage line extending in the first direction; and
   a second driving voltage line extending in the first direction.

6. The display device of claim 5, wherein the first driving voltage line is electrically connected to the second driving voltage line and the first common voltage line is electrically connected to the second common voltage line.

7. The display device of claim 6, wherein the first driving voltage line includes:
   a first line portion extending in the second direction; and
   a first branch portion protruding from the first line portion in the first direction.

8. The display device of claim 7, wherein the first branch portion overlaps the second driving voltage line in the plan view and the first driving voltage line is electrically connected to the second driving voltage line through the first branch portion.

9. The display device of claim 6, wherein the first common voltage line includes:
   a second line portion extending in the second direction; and
   a second branch portion protruding from the second line portion in a direction opposite to the first direction.

10. The display device of claim 9, wherein the second branch portion overlaps the second common voltage line in the plan view and the first common voltage line is electrically connected to the second common voltage line through the second branch portion.

11. The display device of claim 1, wherein the first conductive layer further includes a capacitor electrode.

12. The display device of claim 11, further comprising:
    a gate conductive layer disposed between the first conductive layer and the second conductive layer,
    wherein the gate conductive layer includes:
    a first gate line extending in the first direction; and
    a second gate line spaced apart from the first gate line and extending in the first direction.

13. The display device of claim 12, wherein the first gate line is electrically connected to the first scan line and the second gate line is electrically connected to the second scan line.

14. The display device of claim 12, wherein the gate conductive layer further includes a gate electrode overlapping the capacitor electrode in the plan view and the gate electrode forms a storage capacitor together with the capacitor electrode.

15. The display device of claim 14, further comprising:
    an active layer disposed between the first conductive layer and the gate conductive layer,
    wherein the active layer includes an active pattern overlapping the first gate line in the plan view and electrically connected to the gate electrode.

16. The display device of claim 15, wherein the second conductive layer further includes a data electrode and the data electrode electrically connects the active pattern and the data line.

17. The display device of claim 11, wherein the first scan line includes:
    a first line portion extending in the second direction; and
    a first branch portion protruding from the first line portion in the first direction.

18. The display device of claim 17, further comprising:
    an active layer disposed between the first conductive layer and the second conductive layer,
    wherein the active layer includes an active pattern overlapping the capacitor electrode and the first branch portion of the first scan line in the plan view, and the active pattern forms a storage capacitor together with the capacitor electrode.

19. The display device of claim 11, wherein the second scan line includes:
    a second line portion extending in the second direction; and
    a second branch portion protruding from the second line portion in a direction opposite to the first direction.

20. The display device of claim 1, wherein the data line overlaps the first driving voltage line and the first common voltage line in the plan view.

\* \* \* \* \*